US012772842B2

(12) United States Patent
Kuo et al.

(10) Patent No.: US 12,772,842 B2
(45) Date of Patent: Oct. 20, 2026

(54) SEMICONDUCTOR PACKAGE STRUCTURE

(71) Applicant: MEDIATEK INC., Hsinchu City (TW)

(72) Inventors: Che-Hung Kuo, Hsinchu City (TW); Chun-Yin Lin, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 415 days.

(21) Appl. No.: 18/497,043

(22) Filed: Oct. 30, 2023

(65) Prior Publication Data

US 2024/0063078 A1 Feb. 22, 2024

Related U.S. Application Data

(63) Continuation-in-part of application No. 17/545,015, filed on Dec. 8, 2021, now Pat. No. 11,908,767.

(Continued)

(51) Int. Cl.

*H10W 40/22* (2026.01)
*H10W 70/685* (2026.01)

(Continued)

(52) U.S. Cl.

CPC ......... *H10W 40/22* (2026.01); *H10W 70/685* (2026.01); *H10W 74/121* (2026.01); *H10W 90/00* (2026.01); *H10W 70/60* (2026.01); *H10W 72/877* (2026.01); *H10W 90/288* (2026.01); *H10W 90/722* (2026.01); *H10W 90/725* (2026.01); *H10W 90/734* (2026.01);

(Continued)

(58) Field of Classification Search

CPC ... H10W 40/22; H10W 70/685; H10W 70/60; H10W 74/121; H10W 90/794; H10W 90/725; H10W 90/754

See application file for complete search history.

(56) References Cited

U.S. PATENT DOCUMENTS 9,966,300 B1 * 5/2018 Kelly .................. H10P 90/1914
2009/0309204 A1 * 12/2009 Ha ...................... H10W 90/401
257/E23.101

(Continued)

FOREIGN PATENT DOCUMENTS

CN 103681541 A 3/2014
CN 109786340 A 5/2019
DE 102021120178 A1 3/2022

OTHER PUBLICATIONS

Chinese language office action dated May 30, 2022, issued in application No. TW 110147815.

(Continued)

*Primary Examiner* — Nathan W Ha
(74) *Attorney, Agent, or Firm* — McClure, Qualey & Rodack, LLP

(57) ABSTRACT

A semiconductor package structure includes a first redistribution layer, a first semiconductor die, a second semiconductor die, a thermal spreader, a molding material, and a second redistribution layer. The first semiconductor die and the second semiconductor die are disposed side-by-side over the first redistribution layer. The thermal spreader vertically overlaps with the first semiconductor die and/or the second semiconductor die. The molding material surrounds the thermal spreader, the first semiconductor die and the second semiconductor die. The second redistribution layer is disposed over the molding material.

20 Claims, 15 Drawing Sheets

Related U.S. Application Data

(60) Provisional application No. 63/385,440, filed on Nov. 30, 2022, provisional application No. 63/136,685, filed on Jan. 13, 2021.

(51) Int. Cl.
*H10W 74/10* (2026.01)
*H10W 90/00* (2026.01)
*H10W 70/60* (2026.01)
*H10W 72/00* (2026.01)
*H10W 90/20* (2026.01)

(52) U.S. Cl.
CPC ........ *H10W 90/736* (2026.01); *H10W 90/754* (2026.01); *H10W 90/792* (2026.01); *H10W 90/794* (2026.01)

(56) References Cited

U.S. PATENT DOCUMENTS

| | | | | |
|---|---|---|---|---|
| 2011/0176280 | A1 | 7/2011 | Lee | |
| 2013/0147016 | A1* | 6/2013 | Hauenstein | H10W 42/80 257/536 |
| 2013/0277840 | A1 | 10/2013 | Yu | |
| 2014/0077394 | A1* | 3/2014 | Chang | H10W 40/778 257/782 |
| 2014/0110788 | A1* | 4/2014 | Cho | H10D 30/63 257/368 |
| 2015/0303149 | A1* | 10/2015 | Zhai | H10W 42/20 257/659 |
| 2015/0357309 | A1 | 12/2015 | Liu | |
| 2015/0371917 | A1 | 12/2015 | Colgan | |
| 2017/0365581 | A1* | 12/2017 | Yu | H10W 90/00 |
| 2018/0122791 | A1 | 5/2018 | Liu | |
| 2019/0004573 | A1* | 1/2019 | Kulkarni | G06F 1/20 |
| 2019/0006192 | A1 | 1/2019 | Or-Bach | |
| 2019/0013288 | A1* | 1/2019 | Kim | H10W 20/43 |
| 2019/0057924 | A1 | 2/2019 | Kim | |
| 2019/0067157 | A1 | 2/2019 | Lin | |
| 2019/0067205 | A1 | 2/2019 | Rae | |
| 2019/0206764 | A1 | 7/2019 | Kulkarni | |
| 2019/0229103 | A1 | 7/2019 | Tatsumi | |
| 2019/0237381 | A1 | 8/2019 | Kawashima | |
| 2019/0287942 | A1 | 9/2019 | Mallik | |
| 2019/0311976 | A1 | 10/2019 | Salamone | |
| 2019/0326260 | A1 | 10/2019 | Vadhavkar | |
| 2019/0333909 | A1 | 10/2019 | Sugita | |
| 2020/0013721 | A1 | 1/2020 | Chiang | |
| 2020/0027813 | A1 | 1/2020 | Cheah | |
| 2020/0126890 | A1 | 4/2020 | Singh | |
| 2020/0144165 | A1 | 5/2020 | Park | |
| 2020/0161206 | A1 | 5/2020 | Hu | |
| 2020/0194331 | A1 | 6/2020 | Kim | |
| 2020/0219784 | A1 | 7/2020 | Kim | |
| 2020/0312734 | A1 | 10/2020 | Su | |
| 2020/0312818 | A1 | 10/2020 | Iwashige | |
| 2021/0005527 | A1 | 1/2021 | Choi | |
| 2021/0082894 | A1* | 3/2021 | Chen | H10P 72/74 |
| 2021/0098329 | A1 | 4/2021 | Dai | |
| 2021/0104448 | A1 | 4/2021 | Eid | |
| 2021/0111091 | A1 | 4/2021 | Uppal | |
| 2021/0125914 | A1 | 4/2021 | Harazono | |
| 2021/0134696 | A1 | 5/2021 | Hu | |
| 2021/0327780 | A1* | 10/2021 | Jang | H10W 40/22 |
| 2022/0068750 | A1* | 3/2022 | Ong | H10W 40/22 |
| 2022/0077113 | A1 | 3/2022 | Ong | |
| 2022/0199546 | A1* | 6/2022 | Elsherbini | H10W 42/20 |

OTHER PUBLICATIONS

German language office action dated Apr. 26, 2024, issued in application No. DE 10 2021 133 790.9.

* cited by examiner

SEMICONDUCTOR PACKAGE STRUCTURE

CROSS REFERENCE TO RELATED APPLICATIONS

This application is a Continuation-In-Part of application Ser. No. 17/545,015 filed on Dec. 8, 2021 (now U.S. Pat. No. 11,908,767), which claims the benefit of U.S. Provisional Application No. 63/136,685 filed on Jan. 13, 2021, the entirety of which are incorporated by reference herein. This application also claims the benefit of U.S. Provisional Application No. 63/385,440 filed on Nov. 30, 2022, the entirety of which is incorporated by reference herein.

BACKGROUND OF THE INVENTION

Field of the Invention

The present invention is related to semiconductor packaging technology, and in particular to a semiconductor package structure.

Description of the Related Art

With the increase in demand for smaller devices that can perform more functions, package-on-package (PoP) technology has become increasingly popular. PoP technology vertically stacks two or more package structures. By stacking the package structures, the amount of area on the motherboard that it takes up can be reduced, and thus the cell phone's battery capacity can be increased.

However, although existing semiconductor package structures are generally adequate, they are not satisfactory in every respect. For example, in comparison with package structures that are disposed side-by-side, the stacked package structures share less projection area resources, which makes thermal dissipation worse. Thermal dissipation is a critical problem that needs to be solved since it affects the performance of semiconductor package structures. Therefore, further improvements in semiconductor package structures are required.

BRIEF SUMMARY OF THE INVENTION

Semiconductor package structures are provided. An exemplary embodiment of a semiconductor package structure includes a first redistribution layer, a first semiconductor die, a second semiconductor die, a thermal spreader, a molding material, and a second redistribution layer. The first semiconductor die and the second semiconductor die are disposed side-by-side over the first redistribution layer. The thermal spreader vertically overlaps with the first semiconductor die and/or the second semiconductor die. The molding material surrounds the thermal spreader, the first semiconductor die and the second semiconductor die. The second redistribution layer is disposed over the molding material.

Another exemplary embodiment of a semiconductor package structure includes a first redistribution layer, a first semiconductor die, a second semiconductor die, a thermal spreader, a molding material, and a second redistribution layer. The first semiconductor die and the second semiconductor die are disposed over the first redistribution layer. The thermal spreader is disposed over the first semiconductor die and the second semiconductor die. The molding material extends below the thermal spreader and between the first semiconductor die and the second semiconductor die. The second redistribution layer is disposed over the thermal spreader.

Yet another exemplary embodiment of a semiconductor package structure includes a first redistribution layer, a first semiconductor die, a second semiconductor die, a thermal spreader, a molding material, and a second redistribution layer. The first semiconductor die and the second semiconductor die are disposed side-by-side over the first redistribution layer. The thermal spreader is disposed over the first semiconductor die. The molding material spaces apart the second semiconductor die from the first semiconductor die and the thermal spreader. The second redistribution layer is disposed over the molding material.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
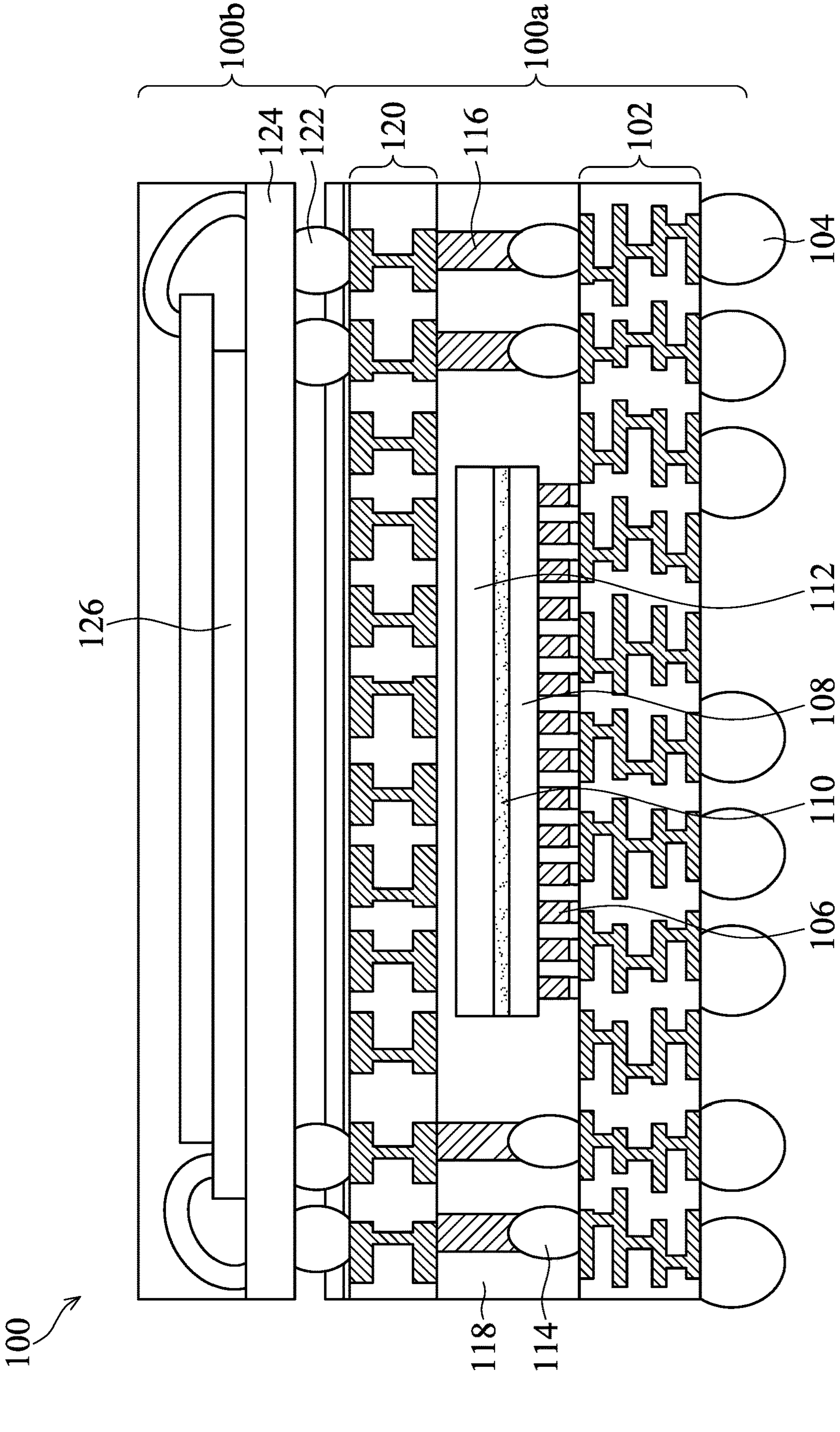
FIG. 1 is a cross-sectional view of an exemplary semiconductor package structure in accordance with some embodiments.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

A semiconductor package structure with a thermal spreader is described in accordance with some embodiments of the present disclosure. The semiconductor package structure includes a thermal spreader adjacent to the thermal source, so that the efficiency of thermal dissipation can be increased, and thus the performance of the semiconductor package structure can be improved.

FIG. 1 is a cross-sectional view of a semiconductor package structure 100 in accordance with some embodiments of the disclosure. Additional features can be added to the semiconductor package structure 100. Some of the features described below can be replaced or eliminated for different embodiments. To simplify the diagram, only a portion of the semiconductor package structure 100 is illustrated.

As shown in FIG. 1, the semiconductor package structure 100 includes a first package structure **100*a* and a second package structure 100*b* stacked vertically, in accordance with some embodiments. As shown in FIG. 1, the first package structure 100*a* includes a substrate 102, in accordance with some embodiments. The substrate 102 may have a wiring structure. In some embodiments, the wiring structure in the substrate 102 includes conductive layers, conductive vias, conductive pillars, the like, or a combination thereof. The wiring structure in the substrate 102** may be formed of metal, such as copper, aluminum, the like, or a combination thereof.

The wiring structure in the substrate 102 may be disposed in inter-metal dielectric (IMD) layers. In some embodiments, the IMD layers may be formed of organic materials, such as a polymer base material, non-organic materials, such as silicon nitride, silicon oxide, silicon oxynitride, the like, or a combination thereof. The substrate 102 may include an insulating core (not shown), such as a fiberglass reinforced resin core, to prevent the substrate 102 from warping.

It should be noted that the configuration of the substrate 102 shown in the figures is exemplary only and is not intended to limit the present disclosure. Any desired semiconductor element may be formed in and on the substrate 102. However, in order to simplify the diagram, only the flat substrate 102 is illustrated.

As shown in FIG. 1, the first package structure **100*a* includes a plurality of conductive terminals 104 disposed below the substrate 102 and electrically coupled to the wiring structure in the substrate 102, in accordance with some embodiments. The conductive terminals 104 may be formed of conductive materials, such as metal. In some embodiments, the conductive terminals 104** includes microbumps, controlled collapse chip connection (C4) bumps, solder balls, ball grid array (BGA) balls, the like, or a combination thereof.

As shown in FIG. 1, the first package structure **100*a* includes a semiconductor die 108 disposed over the substrate 102, in accordance with some embodiments. In some embodiments, the semiconductor die 108 includes a system-on-chip (SoC) die, a logic device, a memory device, a radio frequency (RF) device, the like, or any combination thereof. For example, the semiconductor die 108** may include a micro control unit (MCU) die, a microprocessor unit (MPU) die, a power management integrated circuit (PMIC) die, a radio frequency front end (RFFE) die, an accelerated processing unit (APU) die, a central processing unit (CPU) die, a graphics processing unit (GPU) die, an input-output (IO) die, a dynamic random access memory (DRAM) controller, a static random-access memory (SRAM), a high bandwidth memory (HBM), an application processor (AP) die, the like, or any combination thereof.

According to some embodiments, the first package structure **100*a* may include more than one semiconductor dies. In addition, the first package structure 100*a* may also include one or more passive components (not illustrated) adjacent to the semiconductor die 108**, such as resistors, capacitors, inductors, the like, or a combination thereof.

The semiconductor die 108 may be electrically coupled to the wiring structure in the substrate 102 through a plurality of conductive structures 106. As shown in FIG. 1, the conductive structures 106 may be disposed between the substrate 102 and the semiconductor die 108. In some embodiments, the conductive structures 106 are formed of conductive materials, such as metal. The conductive structures 106 may include conductive pillars, microbumps, controlled collapse chip connection (C4) bumps, solder balls, ball grid array (BGA) balls, the like, or a combination thereof.

As shown in FIG. 1, the first package structure **100*a* includes a thermal spreader 112 disposed over the semiconductor die 108, in accordance with some embodiments. The thermal spreader 112 may be disposed directly above the semiconductor die 108. The thermal spreader 112 may have a higher thermal conductivity than the semiconductor die 108 to improve the efficiency of thermal dissipation of the semiconductor package structure 100. In some embodiments, the thermal spreader 112 includes a metal, a dummy semiconductor die, or a combination thereof. For example, the thermal spreader 112** may include copper, aluminum, silicon, germanium, or any suitable materials.

As shown in FIG. 1, the thermal spreader 112 is bonded onto the semiconductor die 108 through an adhesion layer 110, in accordance with some embodiments. The heat from the thermal source (e.g., the semiconductor die 108) may be transferred to the thermal spreader 112 through the adhesion layer 110. In some embodiments, the adhesion layer 110 includes a die attach film (DAF), an epoxy, the like, or a combination thereof. The thermal conductivity of the thermal spreader 112 may be higher than that of the semiconductor die 108 and that of the adhesion layer 110.

As shown in FIG. 1, the first package structure **100*a* includes a plurality of bump structures 114 disposed over the substrate 102 and adjacent to the semiconductor die 108, in accordance with some embodiments. The bump structures 114 may be electrically coupled to the wiring structure in the substrate 102. The bump structures 114 may be formed of conductive materials, such as metal. In some embodiments, the bump structures 114** include solder balls.

As shown in FIG. 1, the bump structures 114 may be disposed on opposite sides of the semiconductor die 108 and the thermal spreader 112. The configuration of the bump structures 114 shown in the figures is exemplary only and is not intended to limit the present disclosure.

As shown in FIG. 1, the first package structure 100*a* includes a plurality of conductive pillars 116 disposed directly above the bump structures 114, in accordance with some embodiments. The conductive pillars 116 may be electrically coupled to the wiring structure in the substrate 102 through the bump structures 114. In some embodiments, the conductive pillars 116 may be formed of metal, such as copper, tungsten, the like, or a combination thereof.

As shown in FIG. 1, the first package structure 100*a* includes a molding material 118 surrounding the semiconductor die 108, the thermal spreader 112, the bump structures 114, and the conductive pillars 116, in accordance with some embodiments. The molding material 118 may adjoin the sidewalls of the semiconductor die 108 and the thermal spreader 112, and may cover the top surface of the thermal spreader 112 and the top surface of the substrate 102.

In some embodiments, the molding material 118 includes a nonconductive material, such as a moldable polymer, an epoxy, a resin, the like, or a combination thereof. As shown in FIG. 1, the top surface of the molding material 118 and the top surfaces of the conductive pillars 116 may be substantially coplanar. The sidewalls of the molding material 118 may be substantially coplanar with the sidewalls of the substrate 102 and the interposer 120 (described below).

As shown in FIG. 1, the molding material 118 may fill in gaps between the conductive pillars 116, and between the semiconductor die 108 and the conductive pillars 116. The molding material 118 may protect the semiconductor die 108, the bump structures 114, and the conductive pillars 116 from the environment, thereby preventing these components from damage due to, for example, the stress, the chemicals and/or the moisture.

As shown in FIG. 1, the first package structure 100*a* includes an interposer 120 disposed over the molding material 118, in accordance with some embodiments. The interposer 120 and the thermal spreader 112 may be spaced apart by the molding material 118.

The interposer 120 may have a wiring structure. The wiring structure in the interposer 120 may be electrically coupled to the substrate 102 through the conductive pillars 116 and the bump structures 114. In some embodiments, the wiring structure in the interposer 120 includes conductive layers, conductive vias, conductive pillars, the like, or a combination thereof. The wiring structure in the interposer 120 may be formed of metal, such as copper, aluminum, the like, or a combination thereof.

The wiring structure in the interposer 120 may be disposed in inter-metal dielectric (IMD) layers. In some embodiments, the IMD layers may be formed of organic materials, such as a polymer base material, non-organic materials, such as silicon nitride, silicon oxide, silicon oxynitride, the like, or a combination thereof.

It should be noted that the configuration of the interposer 120 shown in the figures is exemplary only and is not intended to limit the present disclosure. Any desired semiconductor element may be formed in and on the interposer 120. However, in order to simplify the diagram, only the flat interposer 120 is illustrated.

As shown in FIG. 1, the second package structure 100*b* is disposed over the first package structure 100*a* and is electrically coupled to the wiring structure in the interposer 120 through a plurality of conductive terminals 122, in accordance with some embodiments. The conductive terminals 122 may be formed of conductive materials, such as metal. In some embodiments, the conductive terminals 122 include microbumps, controlled collapse chip connection (C4) bumps, solder balls, ball grid array (BGA) balls, the like, or a combination thereof.

As shown in FIG. 1, the second package structure 100*b* includes a substrate 124, in accordance with some embodiments. The substrate 124 may have a wiring structure. In some embodiments, the wiring structure of the substrate 124 includes conductive layers, conductive vias, conductive pillars, the like, or a combination thereof. The wiring structure of the substrate 124 may be formed of metal, such as copper, titanium, tungsten, aluminum, the like, or a combination thereof.

The wiring structure of the substrate 124 may be disposed in inter-metal dielectric (IMD) layers. In some embodiments, the IMD layers may be formed of organic materials, such as a polymer base material, a non-organic material, such as silicon nitride, silicon oxide, silicon oxynitride, the like, or a combination thereof. Any desired semiconductor element may be formed in and on the substrate 124. However, in order to simplify the diagram, only the flat substrate 124 is illustrated.

As shown in FIG. 1, the second package structure 100*b* includes semiconductor components 126 disposed over the substrate 124, in accordance with some embodiments. The semiconductor components 126 may include the same or different devices. For example, the semiconductor components 126 may include memory dies, such as a dynamic random access memory (DRAM).

According to some embodiments, the second package structure 100*b* may include more than two semiconductor components 126. In addition, the second package structure 100*b* may also include one or more passive components (not illustrated), such as resistors, capacitors, inductors, the like, or a combination thereof.

Figure 2:
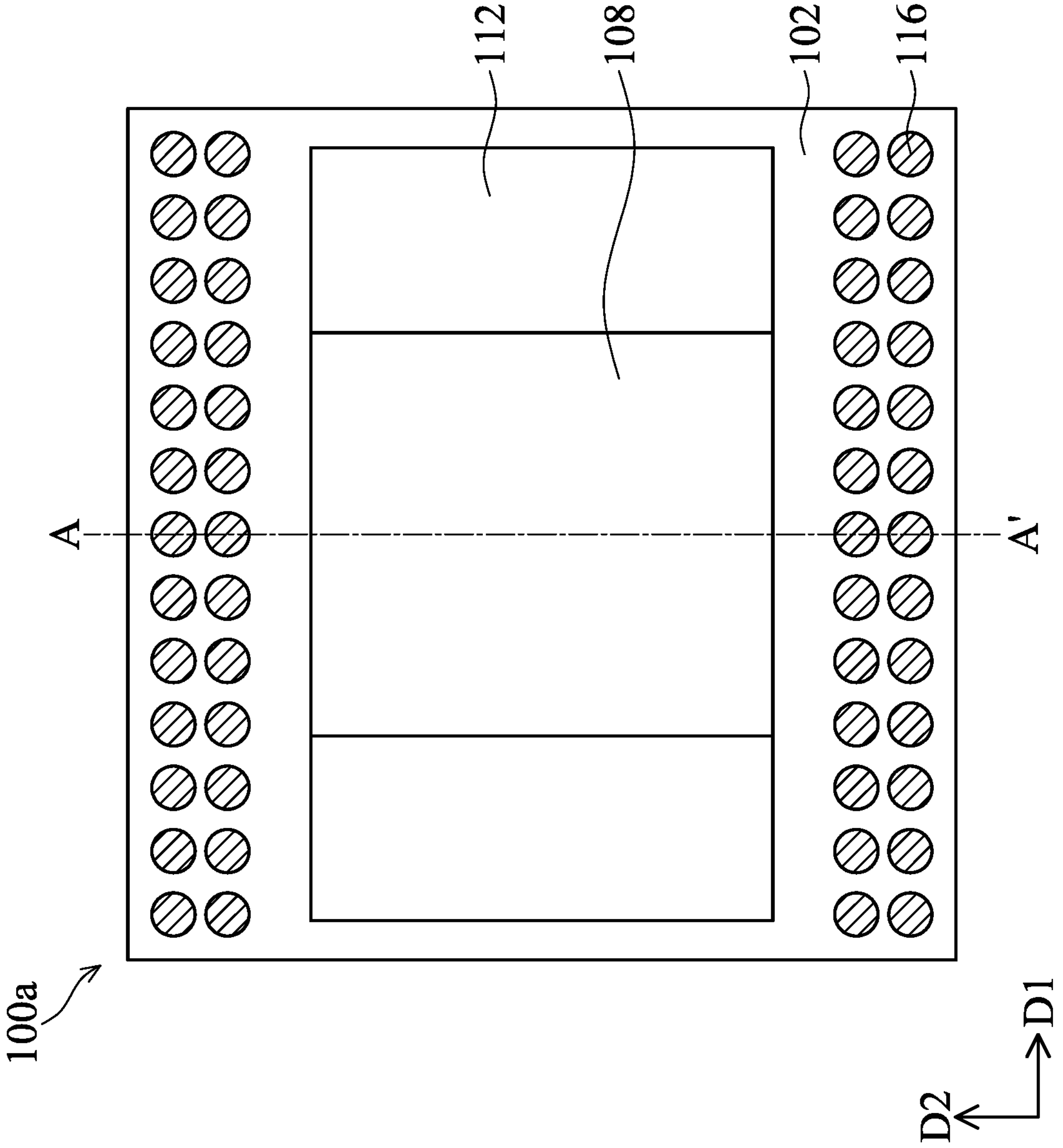
FIG. 2 is a top view of an exemplary first package structure of a semiconductor package structure in accordance with some embodiments.

FIG. 2 is a top view of a first package structure 100*a* of a semiconductor package structure 100 in accordance with some embodiments. To simplify the diagram, only a portion of the semiconductor package structure 100*a* is illustrated in FIG. 2. The first package structure 100*a* in FIG. 1 may be a cross-sectional view taken along a sectional line A-A' in FIG. 2.

As shown in FIG. 2, the thermal spreader 112 has a larger projection area on the substrate 102 than that of the semiconductor die 108, in accordance with some embodiments. As a result, the efficiency of thermal dissipation can be increased. In some embodiments, the thermal spreader 112 has a dimension greater than that of the semiconductor die 108 in the first direction D1, as shown in FIG. 2. The sidewalls of the thermal spreader 112 may be substantially aligned with the sidewalls of the semiconductor die 108 in the second direction D2.

The configurations of the thermal spreader 112 and the semiconductor die 108 shown in the figures are exemplary only and are not intended to limit the present disclosure. For example, in some other embodiments, the thermal spreader 112 may have a dimension greater than that of the semiconductor die 108 in the second direction D2, and the sidewalls of the thermal spreader 112 may be substantially aligned with the sidewalls of the semiconductor die 108 in the first direction D1. Alternatively, the thermal spreader 112 may have dimensions greater than that of the semiconductor die 108 in both of the first direction D1 and the second direction D2.

As shown in FIG. 2, the conductive pillars 116 are disposed on opposite sides of the semiconductor die 108 and the thermal spreader 112, in accordance with some embodiments. The conductive pillars 116 may be arranged in the first direction D1. The configuration of the conductive pillars 116 shown in the figures is exemplary only and is not intended to limit the present disclosure. For example, the conductive pillars 116 may also be arranged in the first direction D1 and the second direction D2 so that the conductive pillars 116 may surround the semiconductor die 108 and the thermal spreader 112.

Figure 3:
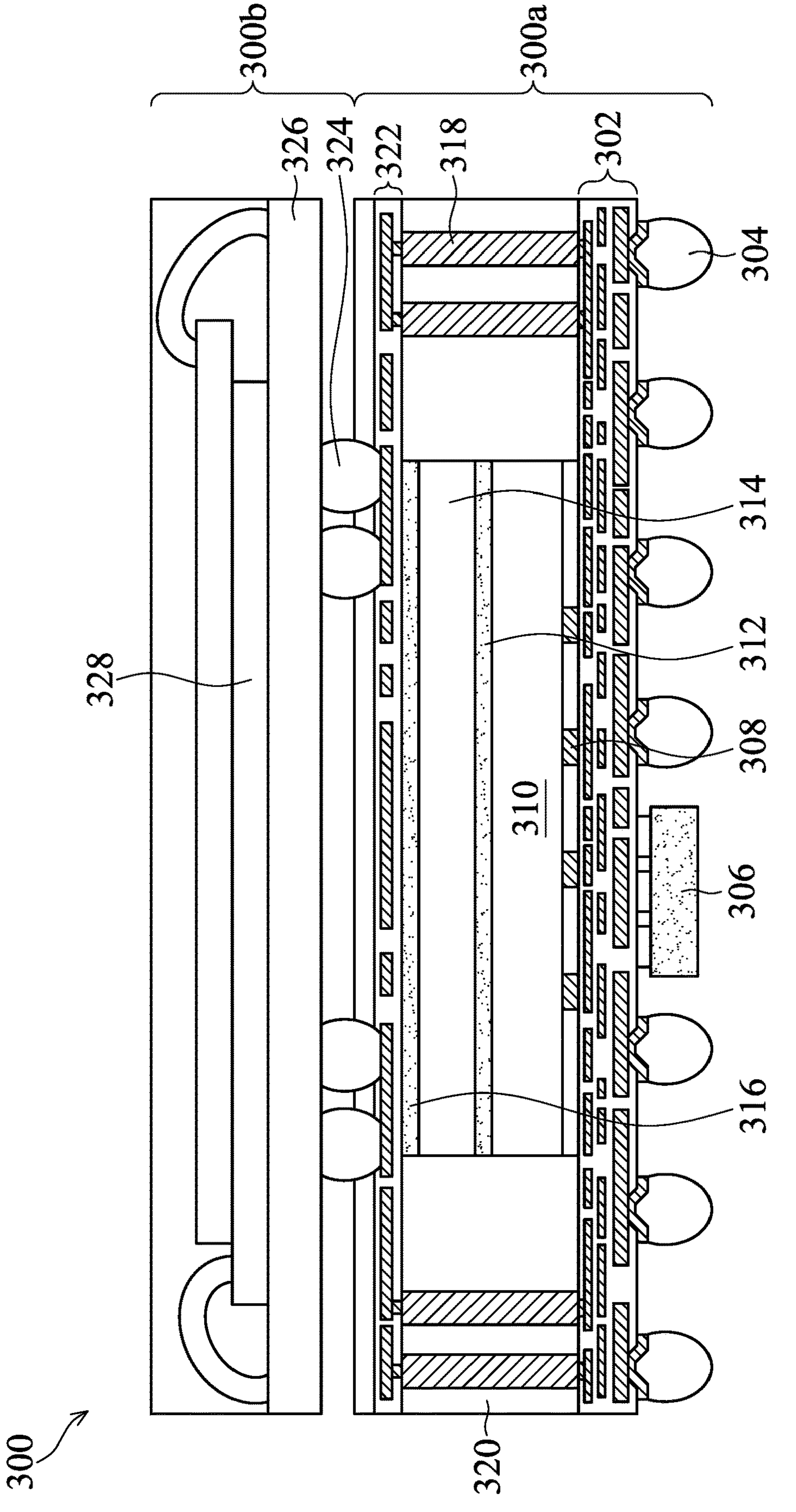
FIG. 3 is a cross-sectional view of an exemplary semiconductor package structure in accordance with some embodiments.

FIG. 3 is a cross-sectional view of a semiconductor package structure 300, in accordance with some embodiments of the disclosure. It should be noted that the semiconductor package structure 300 may include the same or similar components as those of the semiconductor package structure 100, which is illustrated in FIG. 1, and for the sake of simplicity, those components will not be discussed in detail again. In the following embodiments, a thermal spreader is disposed in a fan out package structure.

As shown in FIG. 3, the semiconductor package structure 300 includes a first package structure 300*a* and a second package structure 300*b* stacked vertically, in accordance with some embodiments. The first package structure 300*a* may have a frontside and a backside opposite to the frontside. The first package structure 300*a* may have a first redistribution layer 302 on the frontside and a second redistribution layer 322 on the backside. Therefore, the first redistribution layer 302 may be also referred to as the frontside redistribution layer 302, and the second redistribution layer 322 may be also referred to as the backside redistribution layer 322.

The first redistribution layer 302 may include one or more conductive layers and passivation layers, wherein the conductive layers may be disposed in the passivation layers. The conductive layers may include metal, such as copper, titanium, tungsten, aluminum, the like, or a combination thereof.

In some embodiments, the passivation layers include a polymer layer, for example, polyimide (PI), polybenzoxazole (PBO), benzocyclobutene (BCB), epoxy, the like, or a combination thereof. Alternatively, the passivation layers may include a dielectric layer, such as silicon oxide, silicon nitride, silicon oxynitride, the like, or a combination thereof. The material of the second redistribution layer 322 may be similar to the material of the first redistribution layer 302, and will not be repeated.

As shown in FIG. 3, the first redistribution layer 302 includes more conductive layers and passivation layers than the second redistribution layer 322, in accordance with some embodiments. The first redistribution layer 302 may be thicker than the second redistribution layer 322, but the present disclosure is not limited thereto. For example, the second redistribution layer 322 may be thicker than or substantially equal to the first redistribution layer 302.

As shown in FIG. 3, the first package structure 300*a* includes a plurality of conductive terminals 304 disposed below the first redistribution layer 302 and electrically coupled to the first redistribution layer 302, in accordance with some embodiments. The conductive terminals 304 may be formed of conductive materials, such as metal. In some embodiments, the conductive terminals 304 includes microbumps, controlled collapse chip connection (C4) bumps, solder balls, ball grid array (BGA) balls, the like, or a combination thereof.

As shown in FIG. 3, the first package structure 300*a* includes a capacitor 306 disposed below the first redistribution layer 302 and electrically coupled to the first redistribution layer 302, in accordance with some embodiments. The capacitor 306 may be disposed between the conductive terminals 304.

As shown in FIG. 3, the first package structure 300*a* includes a semiconductor die 310 disposed over the first redistribution layer 302, in accordance with some embodiments. The semiconductor die 310 may be similar to the semiconductor die 108 as shown in FIG. 1, and will not be repeated.

According to some embodiments, the first package structure 300*a* may include more than one semiconductor dies. In addition, the first package structure 300*a* may also include one or more passive components (not illustrated) adjacent to the semiconductor die 310, such as resistors, capacitors, inductors, the like, or a combination thereof.

The semiconductor die 310 may be electrically coupled to the first redistribution layer 302 through a plurality of conductive structures 308. As shown in FIG. 3, the conductive structures 308 may be disposed between the first redistribution layer 302 and the semiconductor die 310. The capacitor 306 may be electrically coupled to the semiconductor die 310 through the first redistribution layer 302 and the conductive structures 308.

In some embodiments, the conductive structures 308 are formed of conductive materials, such as metal. The conductive structures 308 may include conductive pillars, microbumps, controlled collapse chip connection (C4) bumps, solder balls, ball grid array (BGA) balls, the like, or a combination thereof.

As shown in FIG. 3, the first package structure 300*a* includes a thermal spreader 314 disposed over the semiconductor die 310, in accordance with some embodiments. The thermal spreader 314 may be disposed directly above the semiconductor die 310. The thermal spreader 314 may have a higher thermal conductivity than the semiconductor die 310 to improve the efficiency of thermal dissipation of the semiconductor package structure 300. In some embodiments, the thermal spreader 314 includes a metal, a dummy semiconductor die, or a combination thereof. For example, the thermal spreader 314 may include copper, aluminum, silicon, germanium, or any suitable materials.

As shown in FIG. 3, the thermal spreader 314 is bonded onto the semiconductor die 310 through an adhesion layer 312 and bonded onto the second redistribution layer 322 through an adhesion layer 316, in accordance with some embodiments. That is, the adhesion layer 316 may be in contact with the second redistribution layer 322 without a molding material extended therebetween.

The heat from the thermal source (e.g., the semiconductor die 310) may be transferred to the thermal spreader 314 through the adhesion layer 312, and may further be transferred to the second redistribution layer 322 through the adhesion layer 316. Therefore, the second redistribution layer 322 may also serve as a thermal dissipation path. In some embodiments, the adhesion layer 312 and the adhesion layer 316 each independently includes a die attach film (DAF), an epoxy, the like, or a combination thereof. The thermal conductivity of the thermal spreader 314 may be higher than that of the semiconductor die 310, that of the adhesion layer 312, and that of the adhesion layer 316.

As shown in FIG. 3, the first package structure 300*a* includes a plurality of conductive pillars 318 adjacent to the semiconductor die 310 and the thermal spreader 314, in accordance with some embodiments of the disclosure. The conductive pillars 318 may be formed of metal, such as copper, tungsten, the like, or a combination thereof. In some embodiments, the conductive pillars 318 are formed by a plating process or any other suitable process.

As shown in FIG. 3, the conductive pillars 318 may have substantially vertical sidewalls. The conductive pillars 318 may be disposed between the first redistribution layer 302 and the second redistribution layer 322, and may be electrically coupled the first redistribution layer 302 to the second redistribution layer 322.

The configuration of the conductive pillars 318 shown in the figures is exemplary only and is not intended to limit the present disclosure. For example, the number of conductive pillars 318 may be different on opposite sides of the first semiconductor die 312 and the second semiconductor die 306.

As shown in FIG. 3, the first package structure 300*a* includes a molding material 320 surrounding the semiconductor die 310, the thermal spreader 314, and the conductive pillars 318, in accordance with some embodiments. The molding material 320 may adjoin the sidewalls of the semiconductor die 310 and the thermal spreader 314, and may cover the top surface of the first redistribution layer 302 and the bottom surface of the second redistribution layer 322.

As shown in FIG. 3, the molding material 320 may fill in gaps between the conductive pillars 318, and between the semiconductor die 310 and the thermal spreader 314 and the conductive pillars 318. The molding material 320 may protect the semiconductor die 310, the thermal spreader 314, and the conductive pillars 318 from the environment, thereby preventing these components from damage due to, for example, the stress, the chemicals and/or the moisture.

In some embodiments, the molding material 320 includes a nonconductive material, such as a moldable polymer, an epoxy, a resin, the like, or a combination thereof. As shown in FIG. 3, the top surface of the molding material 320 and the top surfaces of the conductive pillars 318 may be substantially coplanar. The sidewalls of the molding material 320 may be substantially coplanar with the sidewalls of the first redistribution layer 302 and the sidewalls of the second redistribution layer 322.

As shown in FIG. 3, the second redistribution layer 322 is disposed over the first semiconductor die 312, in accordance with some embodiments. The second redistribution layer 322 may cover the top surface of the thermal spreader 314, the top surfaces of the conductive pillars 318, and the top surface of the molding material 320.

As shown in FIG. 3, the second package structure 300*b* is disposed over the first package structure 300*a* and is electrically coupled to the second redistribution layer 322 through a plurality of conductive terminals 324, in accordance with some embodiments. The conductive terminals 324 may be similar to the conductive terminals 122 as shown in FIG. 1, and will not be repeated.

As shown in FIG. 3, the second package structure 300*b* includes a substrate 326 and semiconductor components 328 disposed over the substrate 326, in accordance with some embodiments. The substrate 326 and the semiconductor components 328 may be similar to the substrate 124 and the semiconductor components 126 as shown in FIG. 1, respectively, and will not be repeated.

Figure 4:
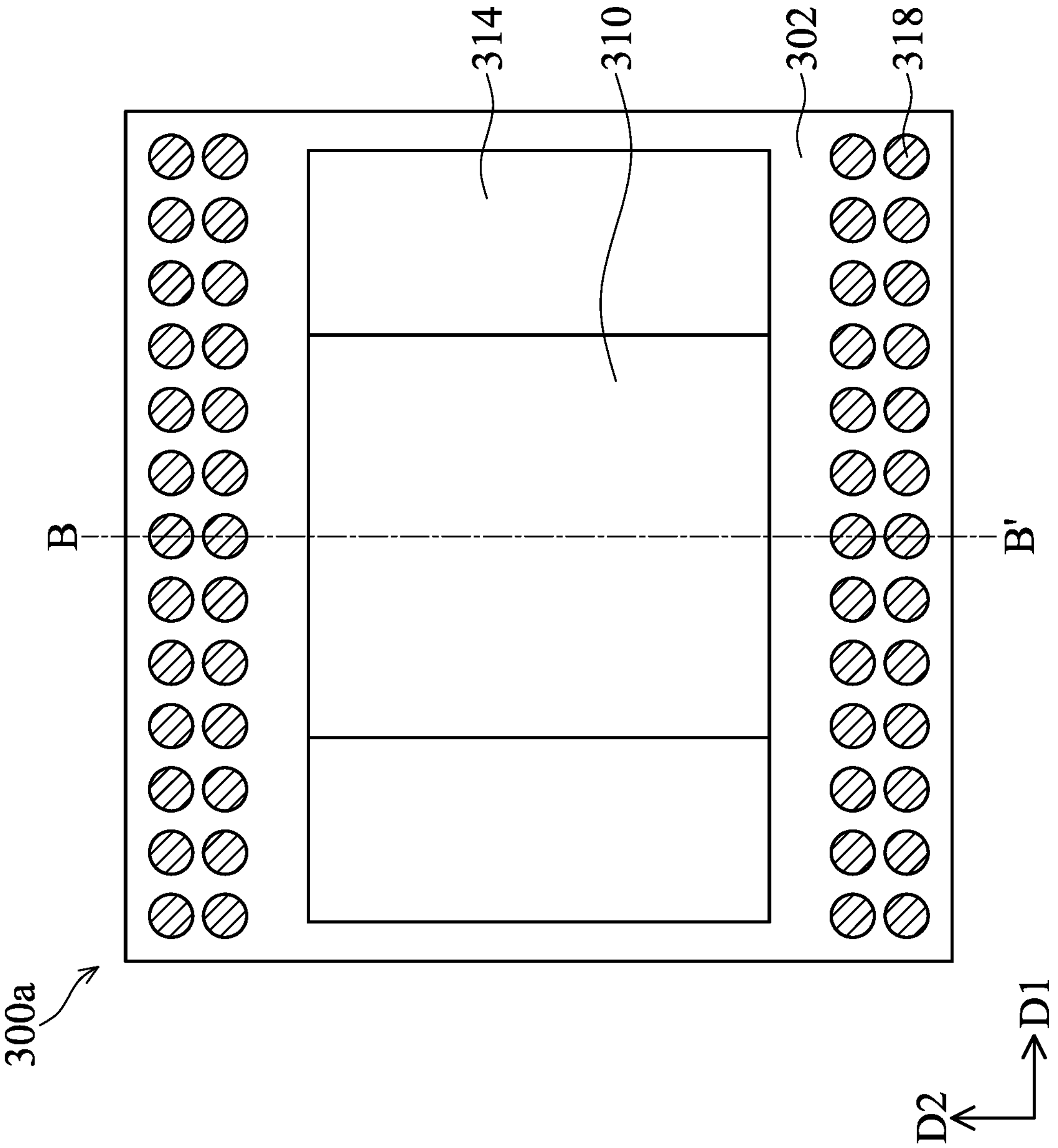
FIG. 4 is a top view of an exemplary first package structure of a semiconductor package structure in accordance with some embodiments.

FIG. 4 is a top view of a first package structure 300*a* of a semiconductor package structure 300 in accordance with some embodiments. To simplify the diagram, only a portion of the semiconductor package structure 300*a* is illustrated in FIG. 4. The first package structure 300*a* in FIG. 3 may be a cross-sectional view taken along a sectional line B-B' in FIG. 4.

As shown in FIG. 4, the thermal spreader 314 has a larger projection area on the first redistribution layer 302 than that of the semiconductor die 310, in accordance with some embodiments. As a result, the efficiency of thermal dissipation can be increased. In some embodiments, the thermal spreader 314 has a dimension greater than that of the semiconductor die 310 in the first direction D1, as shown in FIG. 4. The sidewalls of the thermal spreader 314 may be substantially aligned with the sidewalls of the semiconductor die 310 in the second direction D2.

The configurations of the thermal spreader 314 and the semiconductor die 310 shown in the figures are exemplary only and are not intended to limit the present disclosure. For example, in some other embodiments, the thermal spreader 314 may have a dimension greater than that of the semiconductor die 310 in the second direction D2, and the sidewalls of the thermal spreader 314 may be substantially aligned with the sidewalls of the semiconductor die 310 in the first direction D1. Alternatively, the thermal spreader 314 may have dimensions greater than that of the semiconductor die 310 in both of the first direction D1 and the second direction D2.

As shown in FIG. 4, the conductive pillars 318 are disposed on opposite sides of the semiconductor die 310 and the thermal spreader 314, in accordance with some embodiments. The conductive pillars 318 may be arranged in the first direction D1. The configuration of the conductive pillars 318 shown in the figures is exemplary only and is not intended to limit the present disclosure. For example, the conductive pillars 318 may also be arranged in the first direction D1 and the second direction D2 so that the conductive pillars 318 may surround the semiconductor die 310 and the thermal spreader 314.

In the above embodiments, since the thermal spreader 314 is bonded onto the second redistribution layer 322, the second redistribution layer 322 may also be a thermal dissipation path. That is, the heat from the semiconductor die 310 can be transferred to the thermal spreader 314 and the second redistribution layer 322 besides the first redistribution layer 302. As a result, the efficiency of thermal dissipation can be increased.

Figure 5A:
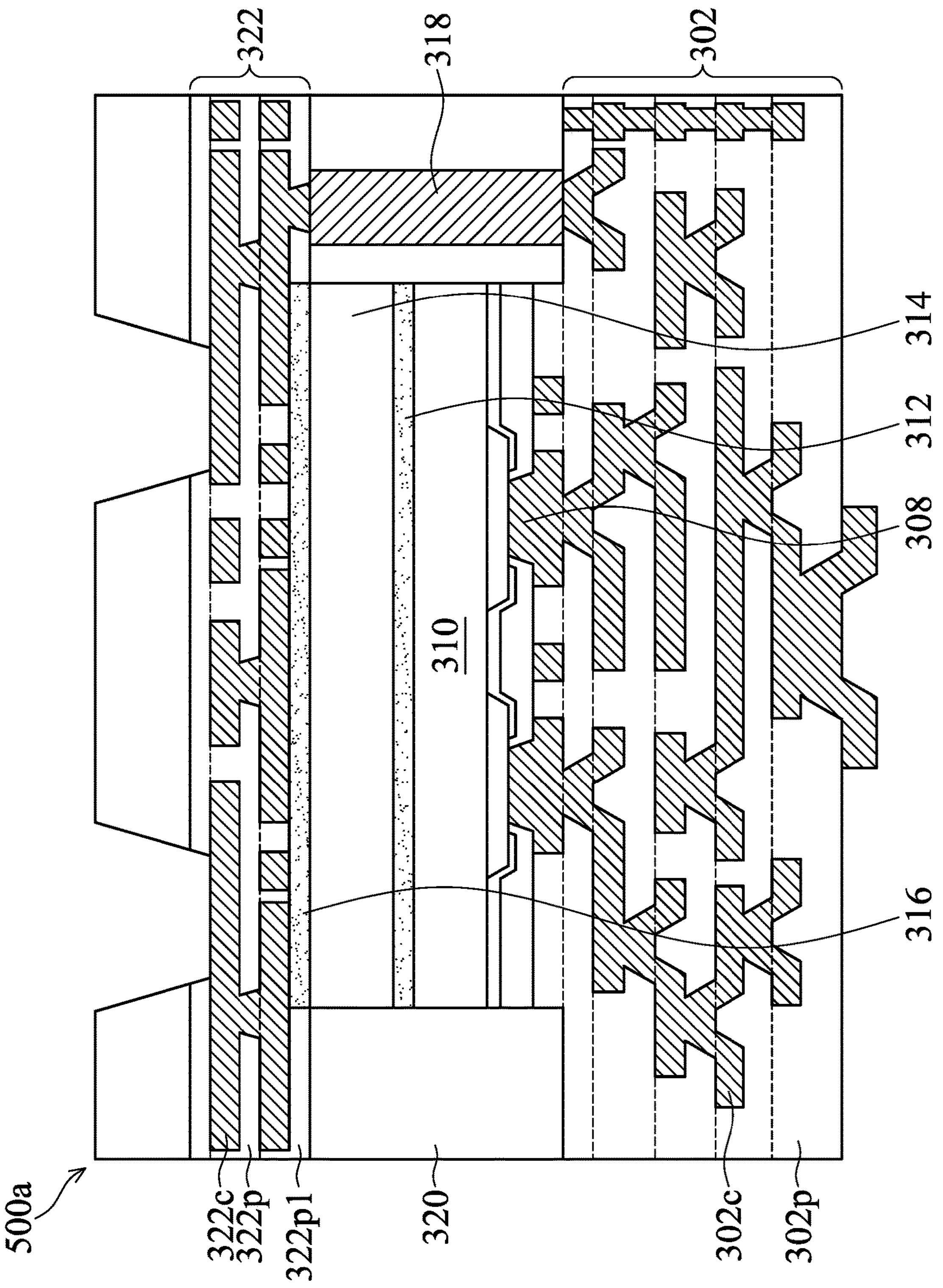
FIG. 5A is a cross-sectional view of an exemplary semiconductor package structure in accordance with some embodiments.

FIG. 5A is a cross-sectional view of a semiconductor package structure 500*a*, in accordance with some embodiments of the disclosure. FIG. 5A illustrates an enlarged region between the conductive terminals 304 and 324 of the semiconductor package structure 300 of FIG. 3, in accordance with some embodiments of the disclosure.

It should be noted that the semiconductor package structure 500*a* may include the same or similar components as those of the semiconductor package structure 300, which is illustrated in FIG. 3, and for the sake of simplicity, those components will not be discussed in detail again. In the following embodiments, an adhesion layer is disposed in a second redistribution layer.

As shown in FIG. 5A, the semiconductor package structure 500*a* includes a first redistribution layer 302 and a second redistribution layer 322, in accordance with some embodiments. The first redistribution layer 302 may include one or more conductive layers 302*c* and passivation layers 302*p*, wherein the conductive layers 302*c* may be disposed in the passivation layers 302*p*.

The second redistribution layer 322 may include one or more conductive layers 322*c* and passivation layers 322*p*, wherein the conductive layers 322*c* may be disposed in the passivation layers 322*p*. In some embodiments, one of the passivation layers 322*p* of the second redistribution layer 322 is in contact with the molding material 320, and is referred to as a first passivation layer 322*p*1.

As shown in FIG. 5A, the adhesion layer 316 may be in contact with the passivation layers 322*p*. The first passivation layer 322*p*1 may have an opening for disposing the adhesion layer 316. In some embodiments, the adhesion layer 316 is embedded in the first passivation layer 322*p*1, as shown in FIG. 5A. In these embodiments, the adhesion layer 316 may be in contact with the conductive layers 322*c* over the first passivation layers 322*p*1.

Alternatively, in some other embodiments, the adhesion layer 316 is not embedded in the first passivation layer 322*p*1, and is disposed on the bottom surface of the second redistribution layer 322, as shown in FIG. 3. That is, the first passivation layer 322*p*1 does not have an opening. In these embodiments, the adhesion layer 316 may be in contact with the conductive layers in the first passivation layer 322*p*1. The molding material 320 may cover sidewalls of the adhesion layer 316. In particular, the top surface of the molding material 320 may be substantially coplanar with the top surface of the adhesion layer 316.

As shown in FIG. 5A, the adhesion layer 316 is fully embedded in the first passivation layer 322*p*1, and the top surface of the thermal spreader 314 is substantially coplanar with the top surface of the molding material 320, in accordance with some embodiments. The configurations of the first passivation layer 322*p*1 and the adhesion layer 316 shown in the figures are exemplary only, and may vary with the thickness of the first passivation layer 322*p*1 and the thickness of the adhesion layer 316.

For example, in the embodiments where the thickness of the first passivation layer 322*p*1 is greater than the thickness of the adhesion layer 316, the adhesion layer 316 may be fully embedded in the first passivation layer 322*p*1, and the thermal spreader 314 may be partially embedded in the second redistribution layer 322. In particular, the first passivation layer 322*p*1 may be in contact with the interface of the adhesion layer 316 and the thermal spreader 314.

Alternatively, in the embodiments where the thickness of the first passivation layer 322*p*1 is less than the thickness of the adhesion layer 316, the adhesion layer 316 may be partially embedded in the second redistribution layer 322. In particular, the molding material 320 may be in contact with the interface of the adhesion layer 316 and the thermal spreader 314.

Figure 5B:
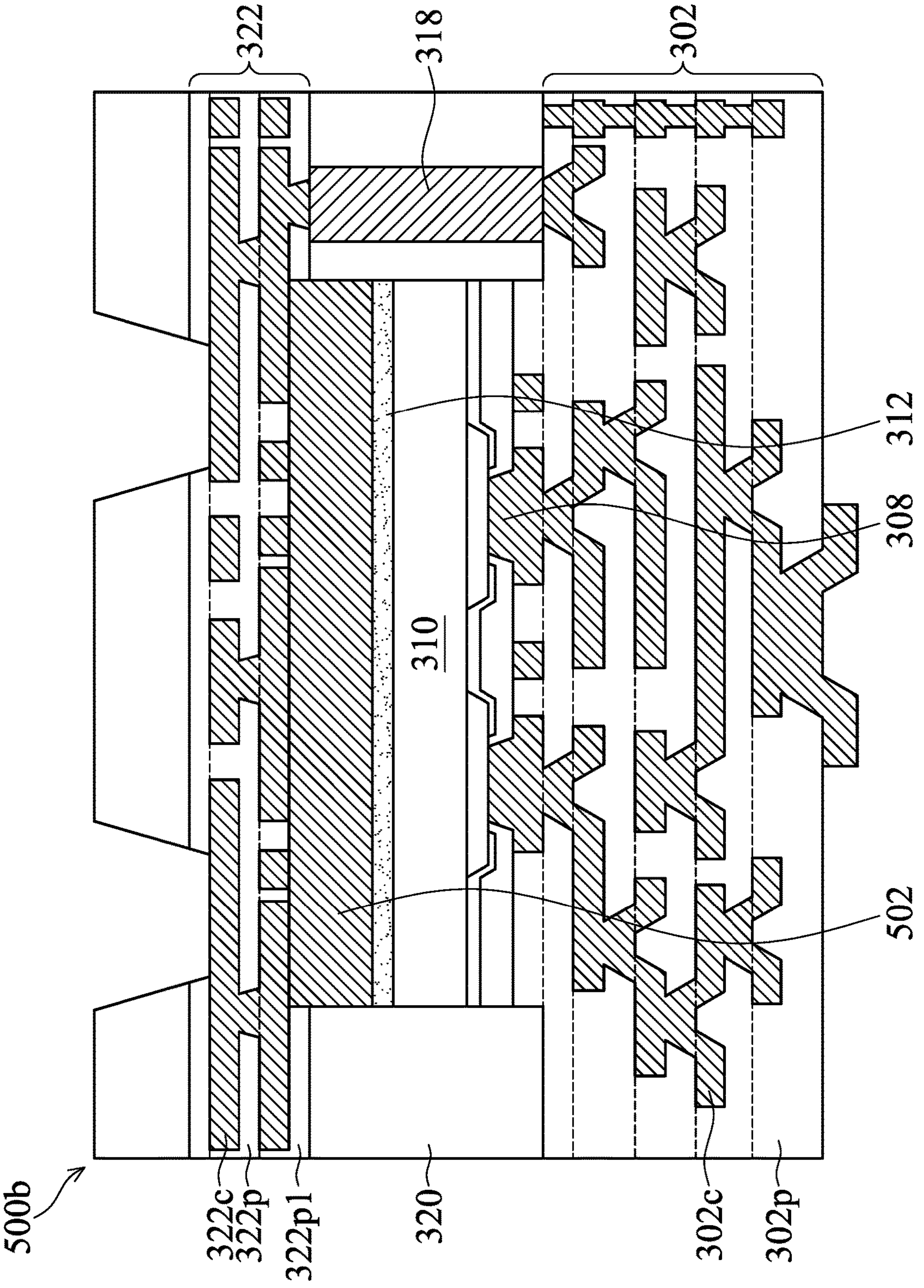
FIG. 5B is a cross-sectional view of an exemplary semiconductor package structure in accordance with some embodiments.

FIG. 5B is a cross-sectional view of a semiconductor package structure 500*b*, in accordance with some embodiments of the disclosure. FIG. 5B illustrates an enlarged region between conductive terminals 304 and 324 of the semiconductor package structure 300 of FIG. 3, in accordance with some embodiments of the disclosure.

It should be noted that the semiconductor package structure 500*b* may include the same or similar components as those of the semiconductor package structure 300, which is illustrated in FIG. 3, and for the sake of simplicity, those components will not be discussed in detail again. In the following embodiments, a thermal spreader is disposed on the second redistribution layer without an adhesion layer therebetween.

As shown in FIG. 5B, the semiconductor package structure 500*b* includes a first redistribution layer 302 and a second redistribution layer 322, in accordance with some embodiments. The first redistribution layer 302 may include one or more conductive layers 302*c* and passivation layers 302*p*, wherein the conductive layers 302*c* may be disposed in the passivation layers 302*p*.

The second redistribution layer 322 may include one or more conductive layers 322*c* and passivation layers 322*p*, wherein the conductive layers 322*c* may be disposed in the passivation layers 322*p*. In some embodiments, one of the passivation layers 322*p* of the second redistribution layer 322 is in contact with the molding material 320, and is referred to as a first passivation layer 322*p*1.

As shown in FIG. 5B, the semiconductor package structure 500*b* includes a thermal spreader 502 disposed on the second redistribution layer 322, in accordance with some embodiments. The thermal spreader 502 may be formed by the process of forming the conductive layers 322*c*, such as plating or any suitable processes.

The thermal spreader 502 may include a material similar to the material of the conductive layers 322*c*. In some embodiments, the thermal spreader 502 includes conductive materials, such as metal. For example, the thermal spreader 502 may include copper, titanium, tungsten, aluminum, the like, or a combination thereof.

As shown in FIG. 5B, the thermal spreader 502 may be in contact with the passivation layers 322*p*. The first passivation layer 322*p*1 may have an opening for disposing the thermal spreader 502. In some embodiments, the thermal spreader 502 is partially embedded in the first passivation layer 322*p*1, as shown in FIG. 5B. In these embodiments, the thermal spreader 502 may be in contact with the conductive layers 322*c* over the first passivation layers 322*p*1.

Alternatively, in some other embodiments, the thermal spreader 502 is not embedded in the first passivation layer 322*p*1, and is disposed on the bottom surface of the second redistribution layer 322. That is, the first passivation layer 322*p*1 does not have an opening. In these embodiments, the thermal spreader 502 may be in contact with the conductive layers in the first passivation layer 322*p*1. In particular, the top surface of the molding material 320 may be substantially coplanar with the top surface of the thermal spreader 502.

As shown in FIG. 5B, the portion of the thermal spreader 502 in the first passivation layer 322*p*1 (referred to as a first portion) and the other portion of the thermal spreader 502 (referred to as a second portion) are illustrated as one component, but the present disclosure is not limited thereto. For example, according to some other embodiments, the thermal spreader 502 may have an interface between the first portion of the thermal spreader 502 and the second portion of the thermal spreader 502, such as when the first portion of the thermal spreader 502 and the second portion of the thermal spreader 502 are formed in different processes.

Since the thermal spreader 314 is formed in contact with the second redistribution layer 322, an adhesion layer formed therebetween can be omitted. Consequently, the heat from the semiconductor die 310 can be directly transferred to the second redistribution layer 322. In addition, the thermal spreader 314 may be formed during the process of forming the second redistribution layer 322, so that process steps can be reduced.

Figure 6:
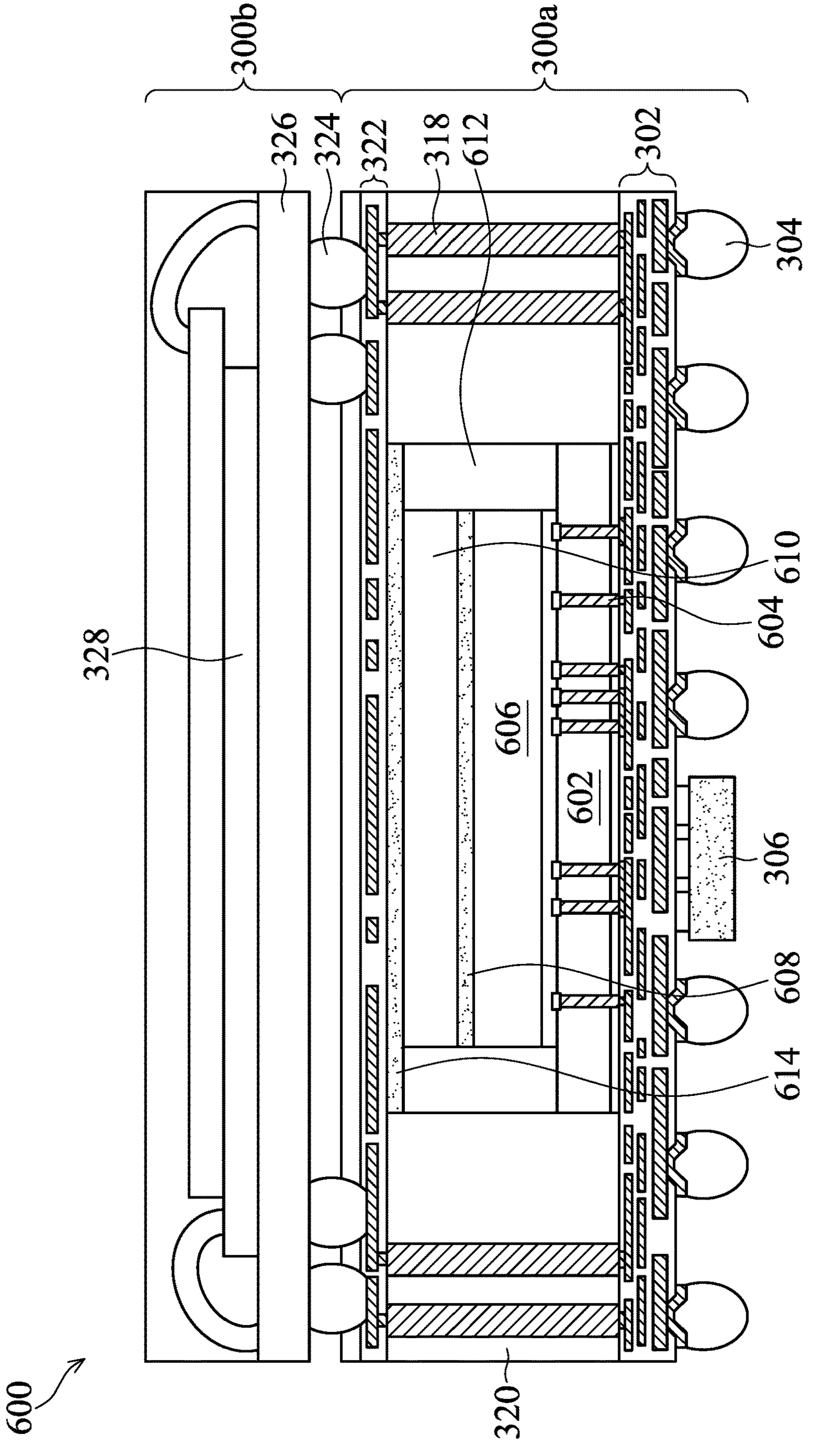
FIG. 6 is a cross-sectional views of an exemplary semiconductor package structure in accordance with some embodiments.

FIG. 6 is a cross-sectional view of a semiconductor package structure 600, in accordance with some embodiments of the disclosure. It should be noted that the semiconductor package structure 600 may include the same or similar components as those of the semiconductor package structure 300, which is illustrated in FIG. 3, and for the sake of simplicity, those components will not be discussed in detail again. In the following embodiments, a thermal spreader is disposed in a three-dimensional integrated circuit (3D IC) package structure.

As shown in FIG. 6, the first package structure 300*a* includes a first semiconductor die 602 and a second semiconductor die 606 stacked vertically over the first redistribution layer 302, in accordance with some embodiments. In some embodiments, each of the first semiconductor die 602 and the second semiconductor die 606 may be similar to the semiconductor die 108 as shown in FIG. 1, and will not be repeated.

According to some embodiments, the first package structure 300*a* may include more than two semiconductor dies. In addition, the first package structure 300*a* may also include one or more passive components (not illustrated) adjacent to the first semiconductor die 602 and/or the second semiconductor die 606, such as resistors, capacitors, inductors, the like, or a combination thereof.

In some embodiments, the first semiconductor die 602 includes a plurality of through vias 604 therein, which are electrically coupled to the first redistribution layer 302. The second semiconductor die 606 may be electrically coupled to the first redistribution layer 302 through the through vias 604.

The through vias 604 may be formed of metal, such as copper, tungsten, the like, or a combination thereof. As shown in FIG. 6, the through vias 604 may have substantially vertical sidewalls and may extend from the top surface of the first semiconductor die 602 to the bottom surface of the first semiconductor die 602, but the present disclosure is not limited thereto. The through vias 604 may have other configurations and numbers.

As shown in FIG. 6, the first package structure 300*a* includes a thermal spreader 610 disposed over the second semiconductor die 606, in accordance with some embodiments. The thermal spreader 610 may be disposed directly above the second semiconductor die 606. The thermal spreader 610 may have a higher thermal conductivity than the second semiconductor die 606 to improve the efficiency of thermal dissipation of the semiconductor package structure 600. In some embodiments, the thermal spreader 610 includes a metal, a dummy semiconductor die, or a combination thereof. For example, the thermal spreader 610 may include copper, aluminum, silicon, germanium, or any suitable materials.

As shown in FIG. 6, the thermal spreader 610 is bonded onto the second semiconductor die 606 through an adhesion layer 608 and is bonded onto the second redistribution layer 322 through an adhesion layer 614, in accordance with some embodiments. That is, the adhesion layer 614 may be in contact with the second redistribution layer 322 without a molding material extended therebetween.

The heat from the thermal source (e.g., the first semiconductor die 602 and the second semiconductor die 606) may be transferred to the thermal spreader 610 through the adhesion layer 608, and may further be transferred to the second redistribution layer 322 through the adhesion layer 614. Therefore, the second redistribution layer 322 may also serve as a thermal dissipation path. In some embodiments, the adhesion layer 608 and the adhesion layer 614 each independently includes a die attach film (DAF), an epoxy, the like, or a combination thereof. The thermal conductivity of the thermal spreader 610 may be higher than that of the second semiconductor die 606, that of the adhesion layer 608, and that of the adhesion layer 614.

Similar to above description regarding to the first package structure 300*a* in FIG. 4, the thermal spreader 610 may have a larger projection area on the first redistribution layer 302 than that of the second semiconductor die 606 to increase the efficiency of thermal dissipation. Furthermore, although not illustrated, the projection area of the thermal spreader 610 on the first redistribution layer 302 may also be larger than that of the first semiconductor die 602.

The configurations of the thermal spreader 610, the first semiconductor die 602, the second semiconductor die 606, and the conductive pillars 318 may be similar to the description regarding to the first package structure 300*a* in FIG. 4. For example, the thermal spreader 610 may have a dimension which is greater than that of the first semiconductor die 602 and/or the second semiconductor die 606 in the first direction D1. In addition, the sidewalls of the thermal spreader 610 may be substantially aligned with the sidewalls of the semiconductor die 602 and/or the sidewalls of the second semiconductor die 606 in the second direction D2. The conductive pillars 318 may be arranged in the first direction D1.

The details may refer to the description regarding to the first package structure 300*a* in FIG. 4 and will not be repeated. It should be noted that the configurations of the thermal spreader 610, the first semiconductor die 602, the second semiconductor die 606, and the conductive pillars 318 are exemplary only and are not intended to limit the present disclosure.

The configurations of the thermal spreader 610, the adhesion layer 614, and the second redistribution layer 322 may be similar to the description regarding to the semiconductor package structure 500*a* in FIG. 5A or the description regarding to the semiconductor package structure 500*b* in 5B. For example, the adhesion layer 614 and/or the thermal spreader 610 may be partially embedded in the second redistribution layer 322 according to some embodiments. The adhesion layer 614 may be omitted according to some other embodiments.

The details may refer to the description regarding to the semiconductor package structure 500*a* in FIG. 5A or the description regarding to the semiconductor package structure 500*b* in 5B, and will not be repeated. It should be noted that the configurations of the thermal spreader 610, the adhesion layer 614, and the second redistribution layer 322 are exemplary only and are not intended to limit the present disclosure.

Referring back to FIG. 6, the first package structure 300*a* includes a molding material 612 surrounding the second semiconductor die 606, the adhesion layer 608, and the thermal spreader 610, in accordance with some embodiments. The molding material 612 may cover the top surface of the first semiconductor die 602 and may adjoin the sidewalls of the second semiconductor die 606. The molding material 612 may protect the second semiconductor die 606, the adhesion layer 608, and the thermal spreader 610 from the environment, thereby preventing these components from damage due to, for example, the stress, the chemicals and/or the moisture.

The molding material 612 may include a nonconductive material, such as a moldable polymer, an epoxy, a resin, the like, or a combination thereof. As shown in FIG. 6, the top surface of the molding material 612 and the top surface of the thermal spreader 610 are substantially coplanar. The sidewalls of the molding material 612 may be substantially coplanar with the sidewalls of the first semiconductor die 602.

As described above, the thermal spreader 610 may have a larger projection area on the first redistribution layer 302 than that of the second semiconductor die 606. Thus, the molding material 612 may also cover the bottom surface of the thermal spreader 610 or the bottom surface of the adhesion layer 608. According to some embodiments where the projection area of the thermal spreader 610 on the first redistribution layer 302 is also larger than or substantially equal to that of the first semiconductor die 602, the sidewalls of the molding material 612 may be substantially coplanar with the sidewalls of the thermal spreader 610.

As shown in FIG. 6, the adhesion layer 614 may be disposed between the molding material 612 and the second redistribution layer 322 and between the thermal spreader 610 and the second redistribution layer 322. Alternatively, in the embodiments where the sidewalls of the molding material 612 are substantially coplanar with the sidewalls of the thermal spreader 610, the adhesion layer 614 may be disposed between the thermal spreader 610 and the second redistribution layer 322.

In the above embodiment, the heat from the first semiconductor die 602 and the second semiconductor die 606 can be transferred to the thermal spreader 610 and the second redistribution layer 322 besides the first redistribution layer 302, thereby improving the efficiency of thermal dissipation.

Figure 7:
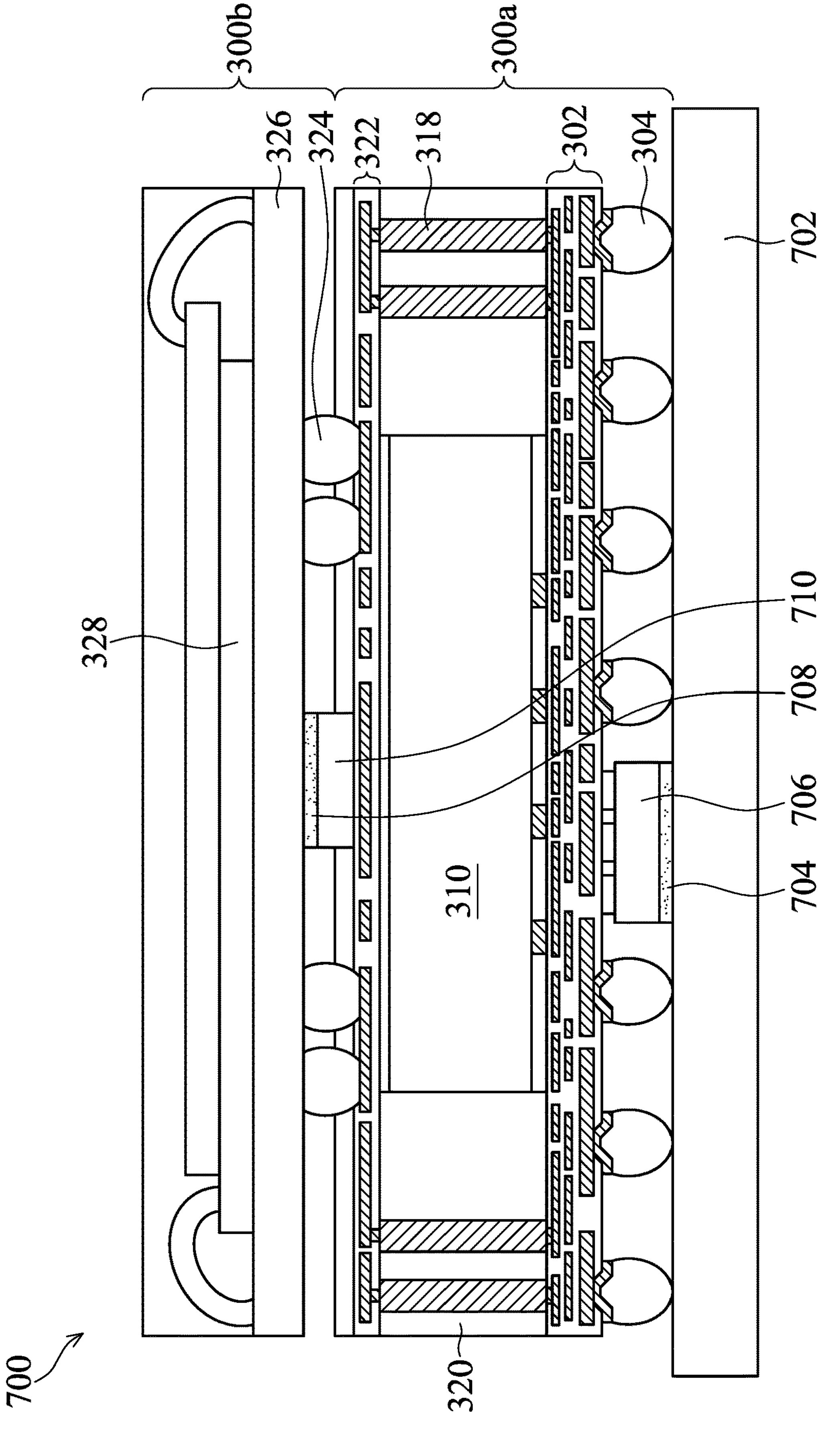
FIG. 7 is a cross-sectional view of an exemplary semiconductor package structure in accordance with some embodiments.

FIG. 7 is a cross-sectional view of a semiconductor package structure 700, in accordance with some embodiments of the disclosure. It should be noted that the semiconductor package structure 700 may include the same or similar components as those of the semiconductor package structure 300, which is illustrated in FIG. 3, and for the sake of simplicity, those components will not be discussed in detail again. In the following embodiments, a passive component may serve as a thermal dissipation path.

As shown in FIG. 7, the semiconductor package structure 700 includes a substrate 702, in accordance with some embodiments. The substrate 702 may have a wiring structure. In some embodiments, the wiring structure in the substrate 702 includes conductive layers, conductive vias, conductive pillars, the like, or a combination thereof. The wiring structure in the substrate 702 may be formed of metal, such as copper, aluminum, the like, or a combination thereof.

The wiring structure in the substrate 702 may be disposed in inter-metal dielectric (IMD) layers. In some embodiments, the IMD layers may be formed of organic materials, such as a polymer base material, non-organic materials, such as silicon nitride, silicon oxide, silicon oxynitride, the like, or a combination thereof. The substrate 702 may include an insulating core (not shown), such as a fiberglass reinforced resin core, to prevent the substrate 702 from warping.

It should be noted that the configuration of the substrate 702 shown in the figures is exemplary only and is not intended to limit the present disclosure. Any desired semiconductor element may be formed in and on the substrate 702. However, in order to simplify the diagram, only the flat substrate 702 is illustrated.

As shown in FIG. 7, the semiconductor package structure 700 includes a first package structure **300*a* and a second package structure 300*b* stacked vertically over the substrate 702, in accordance with some embodiments. Some components in the first package structure 300*a* and the second package structure 300*b* may be similar to some components in the first package structure 300*a* and the second package structure 300*b* as shown in FIG. 3**, and will not be repeated.

As shown in FIG. 7, the semiconductor package structure 700 includes a thermal spreader 706 bonded onto the substrate 702 via a thermal interface material 704, in accordance with some embodiments. The thermal spreader 706 may be thermally coupled to the semiconductor die 310. Therefore, the heat from the semiconductor die 310 can be transferred to the substrate 702 through the thermal interface material 704 and the thermal spreader 706.

In some embodiments, the thermal spreader 706 includes a passive component. For example, the thermal spreader 706 may include a capacitor, which may be electrically coupled to the semiconductor die 310 through the first redistribution layer 302. As a result, the heat from the semiconductor die 310 can be dissipated without using an additional thermal spreader.

As shown in FIG. 7, the thermal spreader 706 may be disposed on the land side. That is, the thermal spreader 706 and the semiconductor die 310 may be disposed on opposite sides of the first redistribution layer 302. The conductive terminals 304 may be disposed adjacent to the thermal spreader 706.

As shown in FIG. 7, the thermal interface material 704 and the semiconductor die 310 may be disposed on opposite sides of the thermal spreader 706. The thermal interface material 704 may include a metal, a polymer having a good thermal conductivity, or any suitable materials. In some embodiments, the thermal interface material 704 includes an adhesive-type material, a gel-type material, the like, or a combination thereof. For example, the thermal interface material 704 may include silicone, polyimide, epoxy, the like, or a combination thereof.

As shown in FIG. 7, the semiconductor package structure 700 includes a thermal spreader 710 bonded onto the substrate 326 via a thermal interface material 708, in accordance with some embodiments. The thermal spreader 710 may be thermally coupled to the semiconductor die 310. Therefore, the heat from the semiconductor die 310 can be transferred to the substrate 326 through the thermal interface material 708 and the thermal spreader 710.

In some embodiments, the thermal spreader 710 includes a passive component. For example, the thermal spreader 710 may include a capacitor, which may be electrically coupled to the semiconductor die 310 or the semiconductor components 328 through the second redistribution layer 322. As a result, the heat from the semiconductor die 310 or the semiconductor components 328 can be dissipated without using an additional thermal spreader.

As shown in FIG. 7, the thermal spreader 710 and the semiconductor die 310 may be disposed on opposite sides of the second redistribution layer 322. The conductive terminals 324 may be disposed adjacent to the thermal spreader 710.

As shown in FIG. 7, the thermal interface material 708 and the semiconductor die 310 may be disposed on opposite sides of the thermal spreader 710. The material of the thermal interface material 708 may be similar to the material of the thermal interface material 704, and will not be repeated.

It should be noted that the configurations of the thermal spreader 706 and the thermal spreader 710 shown in the figures are exemplary only and are not intended to limit the present disclosure. For example, depending on thermal dissipation requirements, the semiconductor package structure 700 may include only one of the thermal spreader 706 and the thermal spreader 710, or may include more than two thermal spreaders.

Although the embodiment as shown in FIG. 7 is described with a semiconductor package structure which includes redistribution layers (e.g., the first redistribution layer 302 and the second redistribution layer 322), the conception according to the present disclosure may be used in any suitable semiconductor package structures. For example, a semiconductor package structure including a substrate and an interposer, such as illustrated in FIG. 1, may have a thermal spreader which includes a passive component. In addition, the semiconductor package structure including a substrate and an interposer may also use a thermal interface material as an adhesion layer.

In summary, in some embodiments, the semiconductor package structure according to the present disclosure includes a thermal spreader bonded onto to the thermal source, such as a semiconductor die, through an adhesion layer. Therefore, the efficiency of thermal dissipation can be increased, and thus the performance of the semiconductor package structure can be improved.

According to some embodiments, the thermal spreader has a larger projection area than that of the semiconductor die to further improve the efficiency of thermal dissipation. Moreover, the thermal spreader may also be bonded onto a redistribution layer, so that the redistribution layer may serve as a thermal dissipation path for enhancing the thermal dissipation.

Furthermore, in some embodiments, the thermal spreader may include one or more passive components which may be electrically coupled to the semiconductor die. As a result, the heat from the semiconductor die can be dissipated without using additional thermal spreaders. In addition, the efficiency of thermal dissipation can be further improved by using a thermal interface material as an adhesion layer.

Figure 8:
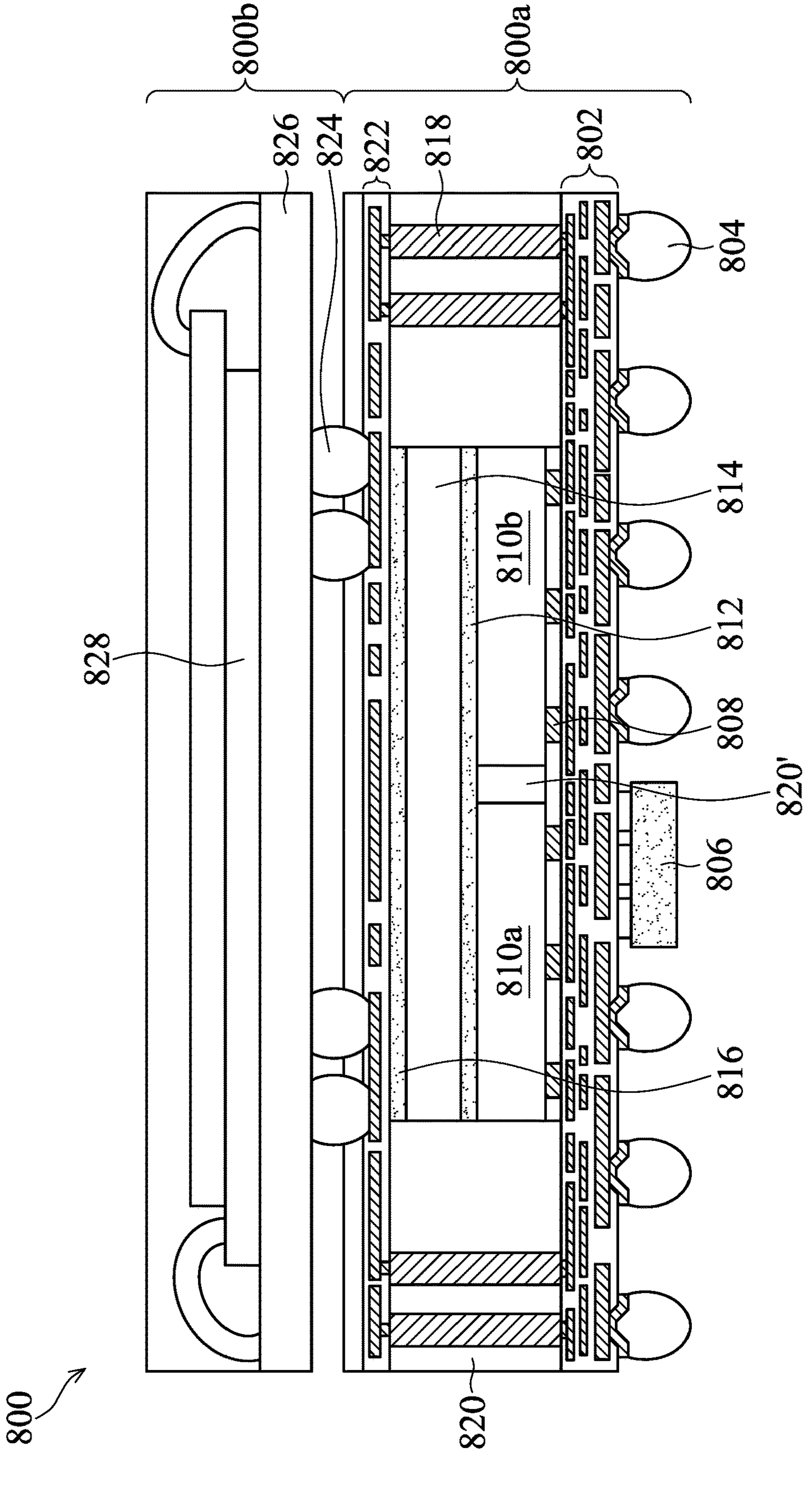
FIG. 8 is a cross-sectional view of an exemplary semiconductor package structure in accordance with some embodiments.

FIG. 8 is a cross-sectional view of a semiconductor package structure 800 in accordance with some embodiments of the disclosure. Additional features can be added to the semiconductor package structure 800. Some of the features described below can be replaced or eliminated for different embodiments. To simplify the diagram, only a portion of the semiconductor package structure 800 is illustrated.

As shown in FIG. 8, the semiconductor package structure 800 includes a first package structure 800*a* and a second package structure 800*b* stacked vertically, in accordance with some embodiments. The first package structure 800*a* may have a frontside and a backside opposite to the frontside, and may include a first redistribution layer 802 on the frontside and a second redistribution layer 822 on the backside.

The first redistribution layer 802 may include one or more conductive layers and passivation layers, wherein the conductive layers may be disposed in the passivation layers. The conductive layers may be formed of conductive materials, including metal (e.g., tungsten, titanium, tantalum, ruthenium, cobalt, copper, aluminum, platinum, tin, silver, gold), metallic compound (e.g., tantalum nitride, titanium nitride, tungsten nitride), the like, an alloy thereof, or a combination thereof.

In some embodiments, the passivation layers include a polymer layer, for example, polyimide (PI), polybenzoxazole (PBO), benzocyclobutene (BCB), epoxy, the like, or a combination thereof. Alternatively, the passivation layers may include a dielectric layer, such as silicon oxide, silicon nitride, silicon oxynitride, the like, or a combination thereof. The material of the second redistribution layer 822 may be similar to the material of the first redistribution layer 802, and will not be repeated.

As shown in FIG. 8, the first package structure 800*a* includes a plurality of conductive terminals 804 disposed below the first redistribution layer 802 and electrically coupled to the first redistribution layer 802, in accordance with some embodiments. The conductive terminals 804 may be formed of conductive materials, such as metal. In some embodiments, the conductive terminals 804 includes microbumps, controlled collapse chip connection (C4) bumps, solder balls, ball grid array (BGA) balls, the like, or a combination thereof.

The first package structure 800*a* includes an integrated passive device (IPD) 806 disposed below the first redistribution layer 802 and electrically coupled to the first redistribution layer 802, in accordance with some embodiments. The IPD 806 may be disposed between the conductive terminals 804.

As shown in FIG. 8, the first package structure 800*a* includes a first semiconductor die 810*a* and a second semiconductor die 810*b* disposed over the first redistribution layer 802, in accordance with some embodiments. The first semiconductor die 810*a* and the second semiconductor die 810*b* may be arranged side-by-side.

In some embodiments, the first semiconductor die 810*a* and the second semiconductor die 810*b* each independently includes a system-on-chip (SoC) die, a logic device, a memory device, a radio frequency (RF) device, the like, or any combination thereof. For example, the first semiconductor die 810*a* and the second semiconductor die 810*b* may each independently include a micro control unit (MCU) die, a microprocessor unit (MPU) die, a power management integrated circuit (PMIC) die, a radio frequency front end (RFFE) die, an accelerated processing unit (APU) die, a central processing unit (CPU) die, a graphics processing unit (GPU) die, an input-output (TO) die, a dynamic random access memory (DRAM) controller, a static random-access memory (SRAM), a high bandwidth memory (HBM), an application processor (AP) die, the like, or any combination thereof.

The first semiconductor die 810*a* and the second semiconductor die 810*b* may include the same or different devices. For example, the first semiconductor die 810*a* may include a device at an advanced wafer node, and the second semiconductor die 810*b* may include a device at a mature wafer node.

In addition, the first package structure 800*a* may include more than two semiconductor dies, and may also include one or more passive components (not illustrated) adjacent to the first semiconductor die 810*a* and the second semiconductor die 810*b*, such as resistors, capacitors, inductors, the like, or a combination thereof.

The first semiconductor die 810*a* and the second semiconductor die 810*b* may be electrically coupled to the first redistribution layer 802 through a plurality of conductive structures 808. The conductive structures 808 may be formed of conductive materials, and the exemplary conductive materials are previously described. The conductive structures 808 may include conductive pillars, microbumps, controlled collapse chip connection (C4) bumps, solder balls, ball grid array (BGA) balls, the like, or a combination thereof.

As shown in FIG. 8, the first package structure 800*a* includes a thermal spreader 814 disposed over the first semiconductor die 810*a* and the second semiconductor die 810*b*, in accordance with some embodiments. The thermal spreader 814 may be disposed directly above the first semiconductor die 810*a* and the second semiconductor die 810*b*. That is, the thermal spreader 814 may vertically overlap with both of the first semiconductor die 810*a* and the second semiconductor die 810*b*.

The thermal spreader 814 may have a higher thermal conductivity than the first semiconductor die 810*a* and the second semiconductor die 810*b* to improve the efficiency of thermal dissipation of the semiconductor package structure 800. In some embodiments, the thermal spreader 814 includes a metal, a dummy semiconductor die, or a combination thereof. For example, the thermal spreader 814 may include copper, aluminum, silicon, germanium, or any suitable materials.

The thermal spreader 814 is bonded onto the first semiconductor die 810*a* and the second semiconductor die 810*b* through an adhesion layer 812 and bonded onto the second redistribution layer 822 through an adhesion layer 816, in accordance with some embodiments. The adhesion layers 812 and 816 may each independently include a die attach film (DAF), an epoxy, the like, or a combination thereof.

The adhesion layer 816 may be in contact with the second redistribution layer 822 without a molding material extended therebetween. Therefore, the heat from the first semiconductor die 810*a* and the second semiconductor die 810*b* can be transferred to the thermal spreader 814 through the adhesion layer 812, and can further be transferred to the second redistribution layer 822 through the adhesion layer 816. The second redistribution layer 822 may thus serve as a thermal dissipation path.

As a result, the heat from the first semiconductor die 810*a* and the second semiconductor die 810*b* can be transferred to the thermal spreader 814 and the second redistribution layer 822 besides the first redistribution layer 802. Therefore, the efficiency of thermal dissipation can be increased.

In addition, the thermal spreader 814 can transfer the heat between the first semiconductor die 810*a* and the second semiconductor die 810*b*. For example, in the embodiments where the first semiconductor die 810*a* includes a device at an advanced wafer node and the second semiconductor die 810*b* includes a device at a mature wafer node, the thermal spreader 814 can share the heat from the first semiconductor die 810*a* to the second semiconductor die 810*b*.

Although one adhesion layer 812 is adopted to bond the thermal spreader 814 onto the first semiconductor die 810*a* and the second semiconductor die 810*b*, the present disclosure is not limited thereto. For example, the thermal spreader 814 may be bonded onto the first semiconductor die 810*a* through different adhesion layers in some other embodiments. In these embodiments, these adhesion layers may have an interface when formed of different materials. Alternatively, a gap or void may be formed between these adhesion layers.

As shown in FIG. 8, the first package structure 800*a* includes a plurality of conductive pillars 818 disposed between the first redistribution layer 802 and the second redistribution layer 822 to electrically couple the first redistribution layer 802 to the second redistribution layer 822, in accordance with some embodiments of the disclosure. The conductive pillars 818 may be formed of conductive materials, and the exemplary conductive materials are previously described.

The first package structure 800*a* includes a molding material 820 surrounding the first semiconductor die 810*a*, the second semiconductor die 810*b*, the thermal spreader 814, and the conductive pillars 818, in accordance with some embodiments. The molding material 820 may protect these components from the environment, thereby preventing them from damage due to stress, chemicals, and moisture.

The molding material 820 may be formed of a nonconductive material, including moldable polymer, epoxy, resin, the like, or a combination thereof. The sidewalls of the molding material 820 may be substantially coplanar with the sidewalls of the first redistribution layer 802 and the sidewalls of the second redistribution layer 822.

The molding material 820 may have a portion 820' extending between the first semiconductor die 810*a* and the second semiconductor die 810*b*. The portion 820' of the molding material 820 may extend below the bottom surface of the adhesion layer 812 as illustrated in FIG. 8. Alternatively, in the embodiments where a gap or void is formed in the adhesion layer 812, the molding material 820 may extend into the adhesion layer 812. In some circumstances, the portion 820' of the molding material 820 may make contact with the thermal spreader 814.

The adhesion layer 816 may be disposed on the bottom surface of the second redistribution layer 822 and surrounded by the molding material 820, as shown in FIG. 8. In particular, the top surface of the molding material 820 may be substantially coplanar with the top surface of the adhesion layer 816, but the present disclosure is not limited thereto. For example, the adhesion layer 816 may be disposed in the second redistribution layer 822, similar to the discussion above with respect to the adhesion layer 316 in FIG. 5A. In this embodiment, a bottommost passivation layer of the second redistribution layer 822 (such as the first passivation layer 322*p*1 in FIG. 5A) may have an opening for disposing the adhesion layer 816.

The configurations of the bottommost passivation layer and the adhesion layer 816 may vary with the thickness of the bottommost passivation layer and the thickness of the adhesion layer 816. For example, in the embodiments where the adhesion layer 816 is fully embedded in the bottommost passivation layer, the top surface of the thermal spreader 814 is substantially coplanar with the top surface of the molding material 820.

In the embodiments where the thickness of the bottommost passivation layer is greater than the thickness of the adhesion layer 816, the adhesion layer 816 may be fully embedded in the bottommost passivation layer, and the thermal spreader 814 may be partially embedded in the second redistribution layer 822. In this embodiment, the bottommost passivation layer is in contact with the interface of the adhesion layer 816 and the thermal spreader 814.

Alternatively, in the embodiments where the thickness of the bottommost passivation layer is less than the thickness of the adhesion layer 816, the adhesion layer 816 may be partially embedded in the second redistribution layer 822. In this embodiment, the molding material 820 is in contact with the interface of the adhesion layer 816 and the thermal spreader 814.

An enlarged region between the conductive terminals 804 and 824 of the semiconductor package structure 800 in FIG. 8 may be similar to the semiconductor package structure 500*a* in FIG. 5A, and the detail discussion will not be repeated.

As shown in FIG. 8, the second package structure 800*b* is disposed over the first package structure 800*a* and is electrically coupled to the second redistribution layer 822 through a plurality of conductive terminals 824, in accordance with some embodiments. The conductive terminals 824 may be formed of conductive materials, such as metal. In some embodiments, the conductive terminals 824 include microbumps, controlled collapse chip connection (C4) bumps, solder balls, ball grid array (BGA) balls, the like, or a combination thereof.

The second package structure 800*b* includes a substrate 826 and semiconductor components 828 disposed over the substrate 826, in accordance with some embodiments. The substrate 826 may have a wiring structure. In some embodiments, the wiring structure of the substrate 826 includes conductive layers, conductive vias, conductive pillars, the like, or a combination thereof. The wiring structure of the substrate 826 may be formed of conductive materials, such as metal.

The wiring structure of the substrate 826 may be disposed in inter-metal dielectric (IMD) layers. In some embodiments, the IMD layers may be formed of organic materials, such as a polymer base material, a non-organic material, such as silicon nitride, silicon oxide, silicon oxynitride, the like, or a combination thereof. Any desired semiconductor element may be formed in and on the substrate 826. However, in order to simplify the diagram, only the flat substrate 826 is illustrated.

The semiconductor components 828 may be electrically coupled to the wiring structure of the substrate 826. The semiconductor components 828 may include the same or different devices. For example, the semiconductor components 828 may include memory dies, such as a dynamic random access memory (DRAM).

The second package structure 800*b* may include more than two semiconductor components 828. In addition, the second package structure 800*b* may also include one or more passive components (not illustrated), such as resistors, capacitors, inductors, the like, or a combination thereof.

Figure 9:
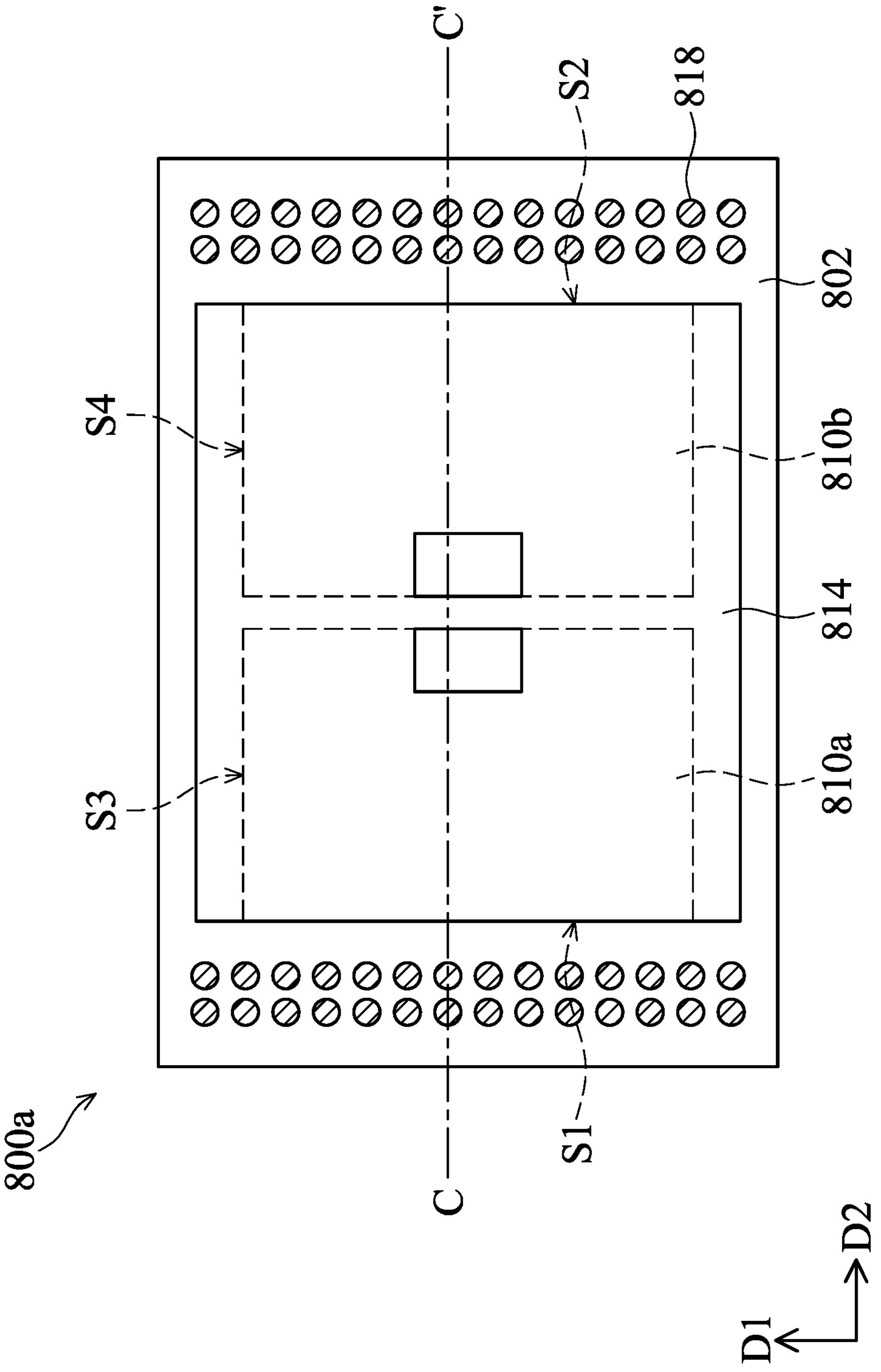
FIG. 9 is a top view of an exemplary first package structure of a semiconductor package structure in accordance with some embodiments.

FIG. 9 is a top view of the first package structure 800*a* of the semiconductor package structure 800 in accordance with some embodiments. To simplify the diagram, only a portion of the semiconductor package structure 800*a* is illustrated in FIG. 9. The first package structure 800*a* in FIG. 8 may be a cross-sectional view taken along a sectional line C-C' in FIG. 9.

As shown in FIG. 9, the thermal spreader 814 has a larger projection area on the first redistribution layer 802 than that of the first semiconductor die 810*a* and that of the second semiconductor die 810*b*, in accordance with some embodiments. In some embodiments, the projection area of the thermal spreader 814 is larger than a total projection area of the first semiconductor die 810*a* and the second semiconductor die 810*b*. As a result, the efficiency of thermal dissipation can be increased.

As shown in FIG. 9, the conductive pillars 818 may be arranged in the first direction D1. The sidewall S1 of the first semiconductor die 810*a* and the sidewall S2 of the second semiconductor die 810*b* may extend in the first direction D1. Opposite sidewalls of the thermal spreader 814 may be substantially aligned with the sidewall S1 of the first semiconductor die 810*a* and the sidewall S2 of the second semiconductor die 810*b*, respectively.

The first semiconductor die 810*a* and the second semiconductor die 810*b* may be arranged in the second direction D2, which is different from the first direction D1. For example, the first direction D1 may be substantially vertical to the second direction D2. The sidewall S3 of the first semiconductor die 810*a* and the sidewall S4 of the second semiconductor die 810*b* may extend in the first direction D2. The thermal spreader 814 may extend in the first direction D1 to cover the sidewall S3 of the first semiconductor die 810*a* and the sidewall S4 of the second semiconductor die 810*b*.

Figure 10:
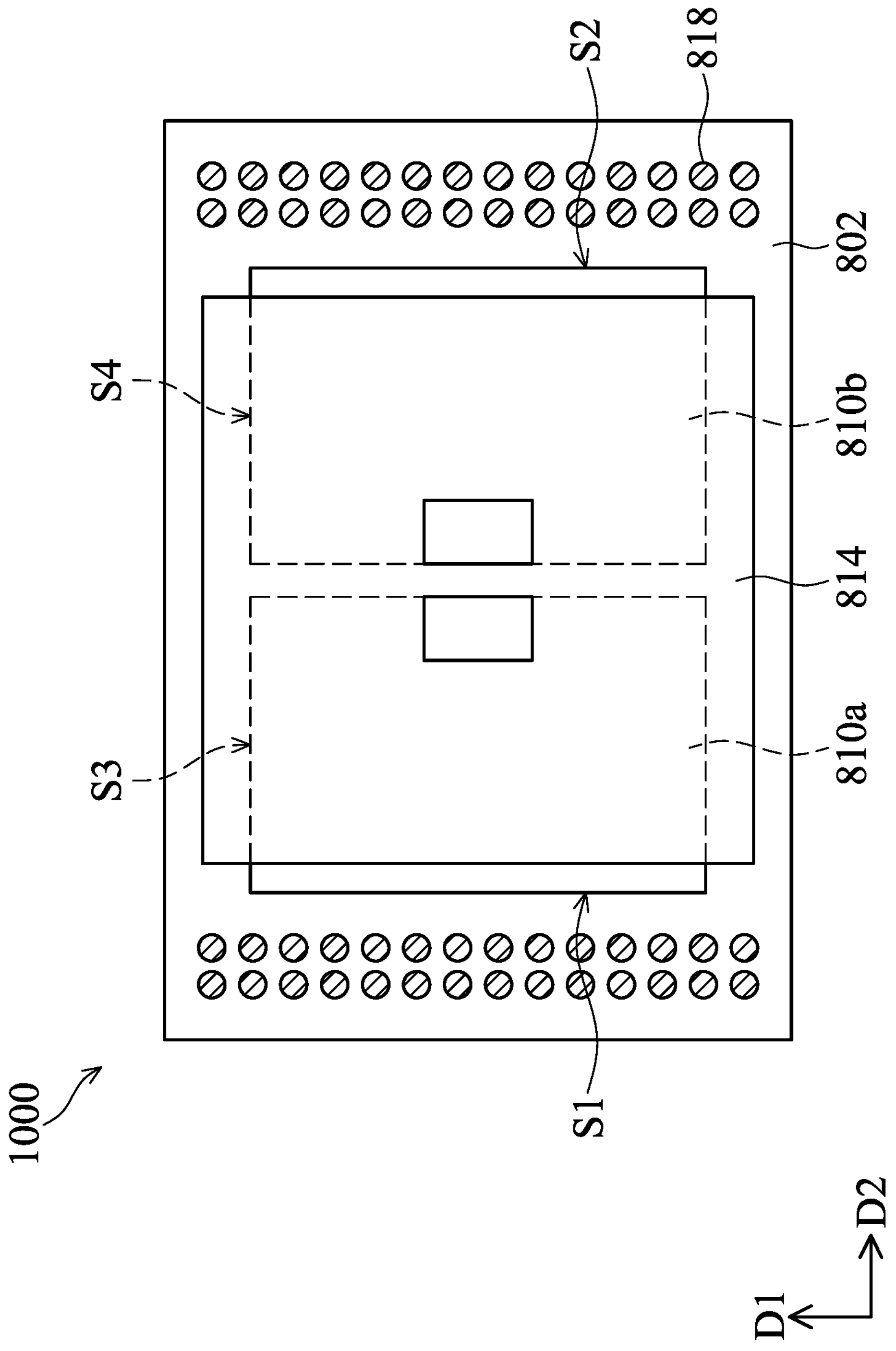
FIG. 10 is a top view of an exemplary first package structure of a semiconductor package structure in accordance with some embodiments.

The configurations of the thermal spreader 814, the first semiconductor die 810*a*, and the second semiconductor die 810*b* shown in the figures are exemplary only and are not intended to limit the present disclosure. FIG. 10 is a top view of a first package structure 1000 of a semiconductor package structure according to some other embodiments. The first package structure 1000 in FIG. 10 may include the same or similar components as those of the first package structure 800*a* in FIG. 9, and for the sake of simplicity, those components will not be discussed in detail again.

As shown in FIG. 10, the thermal spreader 814 may partially overlap with the first semiconductor die 810*a* and the second semiconductor die 810*b*. In particular, the sidewall S1 of the first semiconductor die 810*a* and the sidewall S2 of the second semiconductor die 810*b* may be exposed by the thermal spreader 814. The molding material 820 may extend over the sidewall of the sidewall S1 of the first semiconductor die 810*a* and the sidewall S2 of the second semiconductor die 810*b*.

Figure 11:
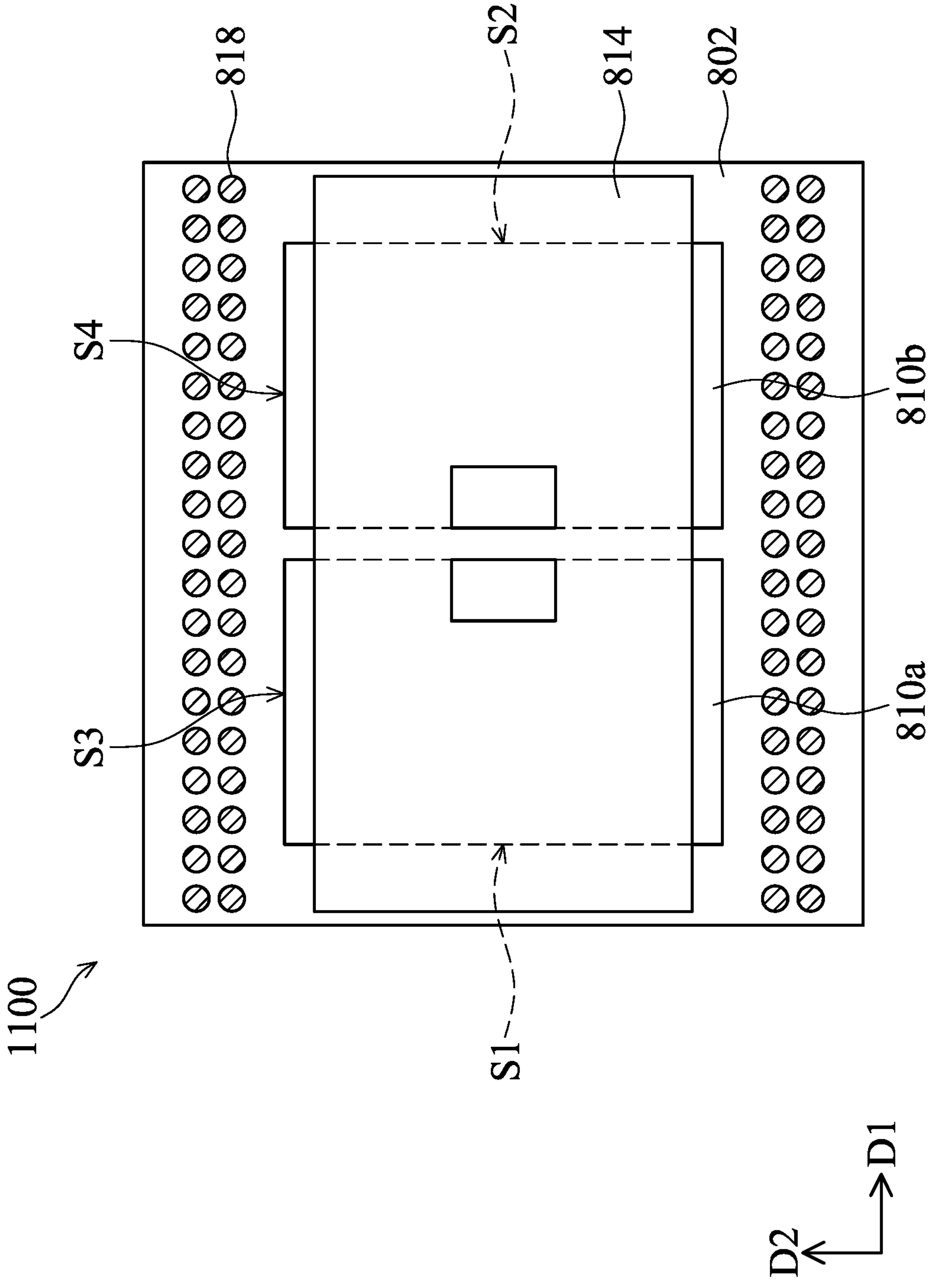
FIG. 11 is a top view of an exemplary first package structure of a semiconductor package structure in accordance with some embodiments.

FIG. 11 is a top view of a first package structure 1100 of a semiconductor package structure according to some other embodiments. The first package structure 1100 in FIG. 11 may include the same or similar components as those of the first package structure 800*a* in FIG. 9, and for the sake of simplicity, those components will not be discussed in detail again.

As shown in FIG. 11, the first semiconductor die 810*a* and the second semiconductor die 810*b* are arranged in the first direction D1. The thermal spreader 814 may partially overlap with the first semiconductor die 810*a* and the second semiconductor die 810*b*. The sidewall S3 of the first semiconductor die 810*a* and the sidewall S4 of the second semiconductor die 810*b*, which extend in the first direction D1, may be exposed by the thermal spreader 814.

Alternatively, the sidewall S3 of the first semiconductor die 810*a* and the sidewall S4 of the second semiconductor die 810*b*, which extend in the first direction D1, may be substantially aligned with the opposite sidewalls of the thermal spreader 814, respectively, similar to the discussion above with respect to the first package structure 800*a* in FIG. 9.

Figure 12:
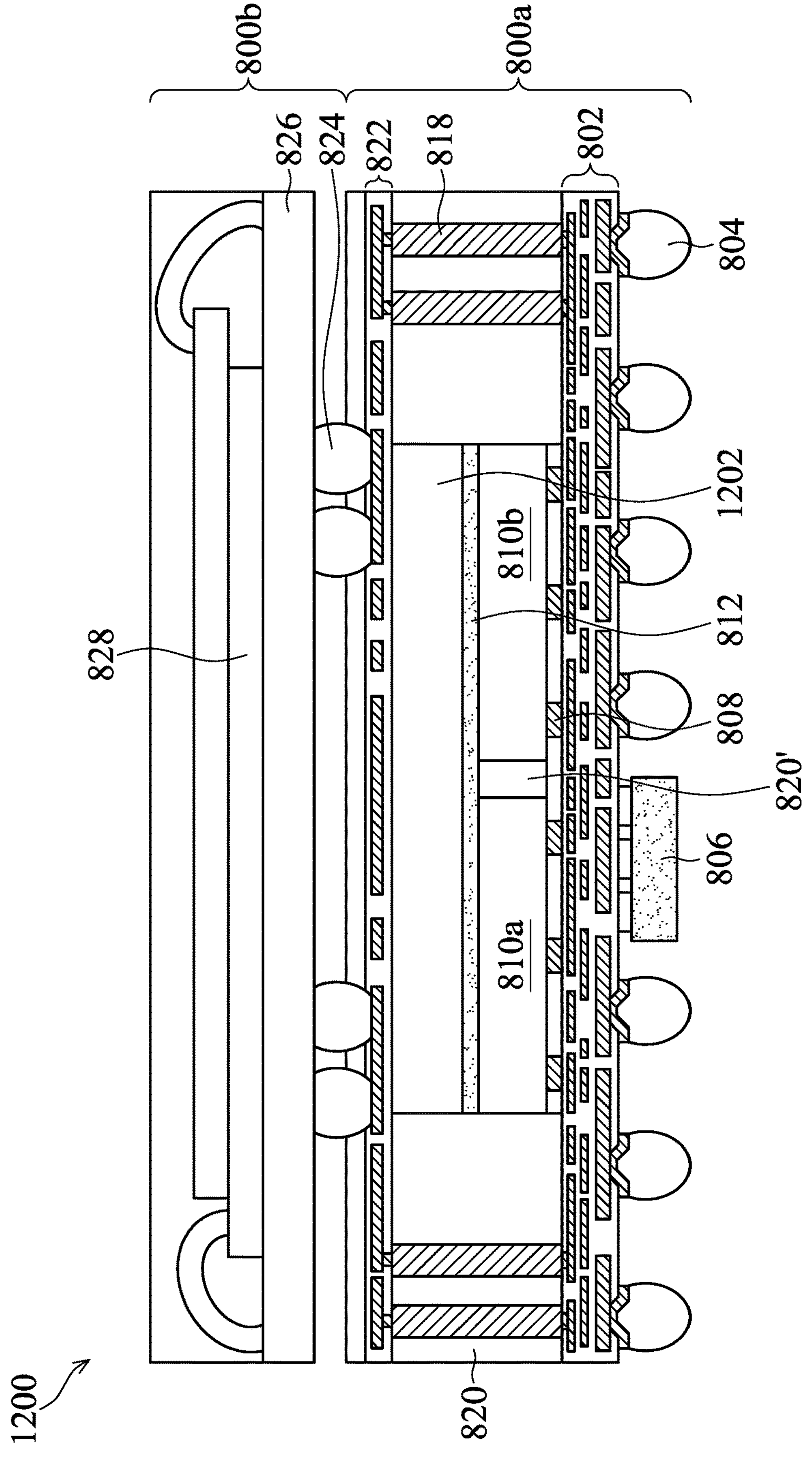
FIG. 12 is a cross-sectional view of an exemplary semiconductor package structure in accordance with some embodiments.

FIG. 12 is a cross-sectional view of a semiconductor package structure 1200, in accordance with some embodiments of the disclosure. It should be noted that the semiconductor package structure 1200 may include the same or similar components as those of the semiconductor package structure 800, which is illustrated in FIG. 8, and for the sake of simplicity, those components will not be discussed in detail again. In the following embodiments, a thermal spreader is disposed on the second redistribution layer 822 without an adhesion layer therebetween.

The thermal spreader 1202 may have a higher thermal conductivity than the first semiconductor die 810*a* and the second semiconductor die 810*b* to improve the efficiency of thermal dissipation of the semiconductor package structure 1200. In some embodiments, the thermal spreader 1202 includes a metal, a dummy semiconductor die, or a combination thereof. For example, the thermal spreader 1202 may include copper, aluminum, silicon, germanium, or any suitable materials.

The thermal spreader 1202 may be in contact with the second redistribution layer 822, so that the heat from the first semiconductor die 810*a* and the second semiconductor die 810*b* can be transferred to the thermal spreader 1202, and can further be transferred to the second redistribution layer 822. Therefore, the efficiency of thermal dissipation can be increased.

The thermal spreader 1202 may be disposed on the bottom surface of the second redistribution layer 822, as shown in FIG. 12. In particular, the top surface of the molding material 820 may be substantially coplanar with the top surface of the thermal spreader 502, but the present disclosure is not limited thereto. For example, the thermal spreader 1202 may be disposed in the second redistribution layer 822, similar to the discussion above with respect to the thermal spreader 502 in FIG. 5B. In this embodiment, a bottommost passivation layer of the second redistribution layer 822 (such as the first passivation layer 322*p*1 in FIG. 5B) may have an opening for disposing the thermal spreader 1202.

In some embodiments, the thermal spreader 1202 includes a material similar to the material of the conductive layers of the second redistribution layer 822. For example, the thermal spreader 1202 may include copper, titanium, tungsten, aluminum, the like, or a combination thereof. The thermal spreader 1202 may be formed by the process of forming the conductive layers of the second redistribution layer 822, such as plating or any suitable processes.

An enlarged region between the conductive terminals 804 and 824 of the semiconductor package structure 800 in FIG. 9 may be similar to the semiconductor package structure 500*b* in FIG. 5B, and the detail discussion will not be repeated.

Figure 13:
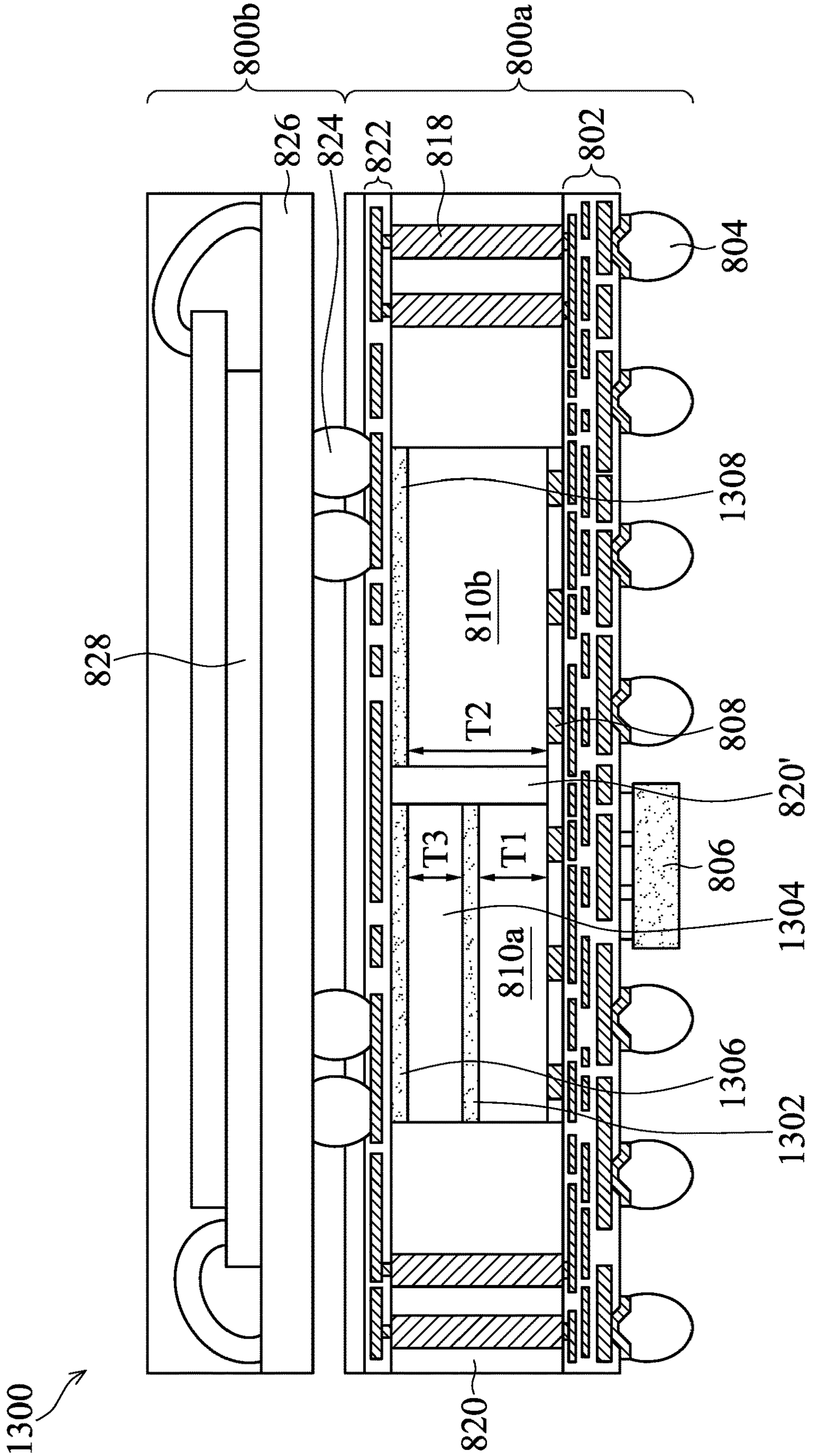
FIG. 13 is a cross-sectional view of an exemplary semiconductor package structure in accordance with some embodiments.

FIG. 13 is a cross-sectional view of a semiconductor package structure 1300, in accordance with some embodiments of the disclosure. It should be noted that the semiconductor package structure 1300 may include the same or similar components as those of the semiconductor package structure 800, which is illustrated in FIG. 8, and for the sake of simplicity, those components will not be discussed in detail again. In the following embodiments, a thermal spreader is disposed over one of the semiconductor dies.

As shown in FIG. 13, the semiconductor package structure 1300 includes a thermal spreader 1304 disposed directly above the first semiconductor die 810*a* and not directly above the second semiconductor die 810*b*, in accordance with some embodiments of the disclosure. That is, the thermal spreader 1304 may vertically overlap with the first semiconductor die 810*a* and may not vertically overlap with the second semiconductor die 810*b*.

The thermal spreader 1304 may have a higher thermal conductivity than the first semiconductor die 810*a* to improve the efficiency of thermal dissipation of the semiconductor package structure 1300. In some embodiments, the thermal spreader 1304 includes a metal, a dummy semiconductor die, or a combination thereof. For example, the thermal spreader 1304 may include copper, aluminum, silicon, germanium, or any suitable materials.

The thermal spreader 1304 may be bonded onto the first semiconductor die 810*a* through an adhesion layer 1302 and bonded onto the second redistribution layer 822 through an adhesion layer 1306. The second semiconductor die 810*b* may be bonded onto the second redistribution layer 822 through an adhesion layer 1308. The adhesion layers 1302, 1306 and 1308 each independently includes a die attach film (DAF), an epoxy, the like, or a combination thereof.

The adhesion layers 1306 and 1308 may be in contact with the second redistribution layer 822 without a molding material extended therebetween. Therefore, the heat from the first semiconductor die 810*a* can be transferred to the thermal spreader 1304 through the adhesion layer 1306, and can further be transferred to the second redistribution layer 822 through the adhesion layer 1306. In addition, the heat from the second semiconductor die 810*b* can be transferred to the second redistribution layer 822 through the adhesion layer 1308, and can further be transferred to the thermal spreader 1304 through the adhesion layer 1306.

As a result, the heat from the first semiconductor die 810*a* and the second semiconductor die 810*b* can be transferred to the thermal spreader 1304 and the second redistribution layer 822 besides the first redistribution layer 802. Therefore, the efficiency of thermal dissipation can be increased.

As shown in FIG. 13, the thickness T2 of the second semiconductor die 810*b* may be greater than the thickness T1 of the first semiconductor die 810*a* and may be greater than the thickness T3 of the thermal spreader 1304. The thickness T2 of the second semiconductor die 810*b* may be greater than the total thickness of the first semiconductor die 810*a* and the thermal spreader 1304.

As illustrated in FIG. 13, the molding material 820 may have a portion 820' extending between the first semiconductor die 810*a* and the second semiconductor die 810*b* and between thermal spreader 1304 and the second semiconductor die 810*b*. The portion 820' of the molding material 820 may space apart the second semiconductor die 810*b* from the first semiconductor die 810*a* and the thermal spreader 1304.

The portion 820' of the molding material 820 may extend between the adhesion layer 1306 and the adhesion layer 1308, but the present disclosure is not limited thereto. For example, the adhesion layer 1306 may connect the adhesion layer 1308 in some other embodiments, and the portion 820' of the molding material 820 may extend below the bottom surface of the connected adhesion layer.

Figure 14:
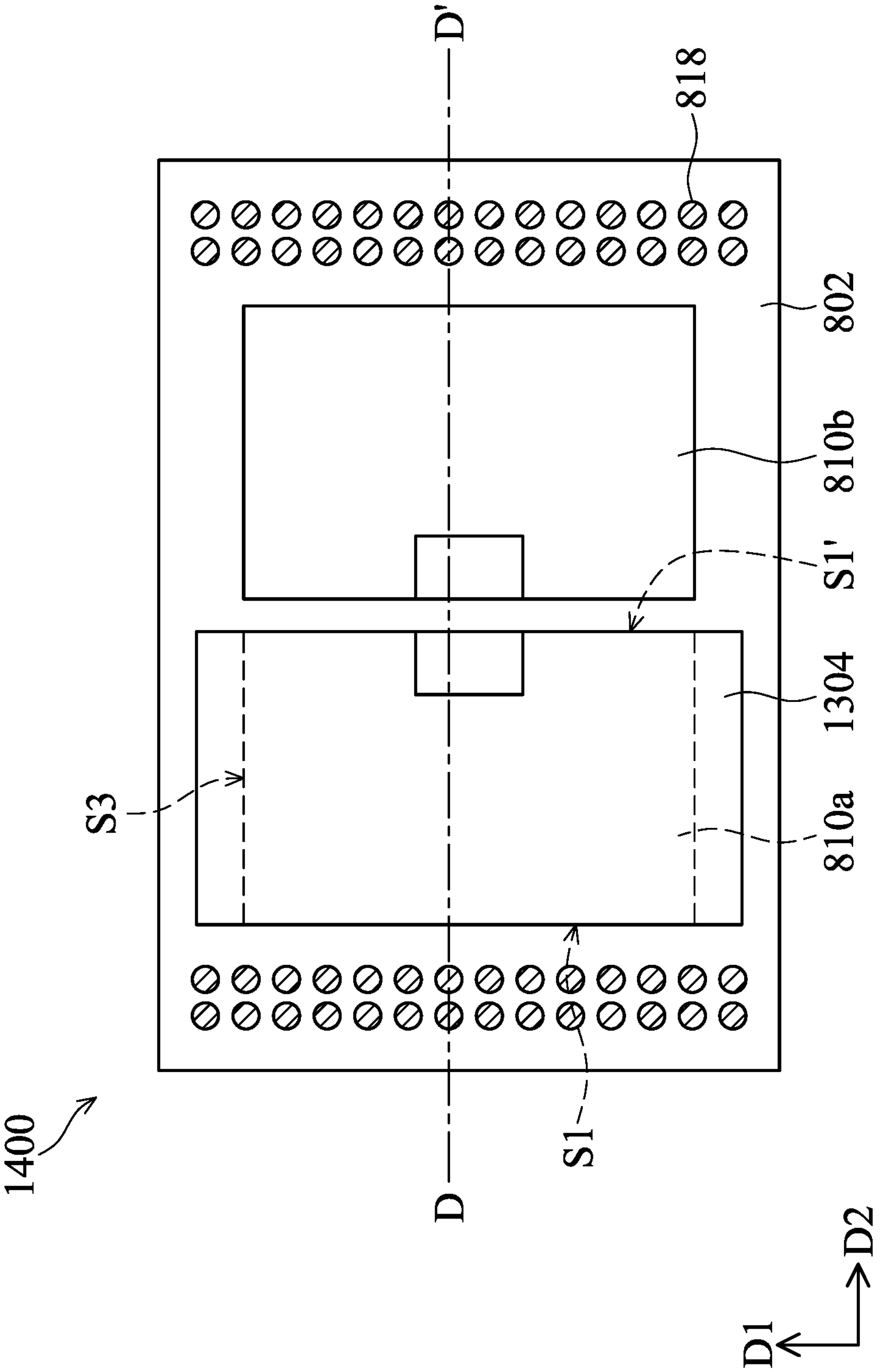
FIG. 14 is a top view of an exemplary first package structure of a semiconductor package structure in accordance with some embodiments.

FIG. 14 is a top view of a first package structure 1400 of a semiconductor package structure in accordance with some embodiments. To simplify the diagram, only a portion of the semiconductor package structure 1400 is illustrated in FIG. 14. The first package structure 1400 in FIG. 14 may be a cross-sectional view taken along a sectional line D-D' in FIG. 13.

As shown in FIG. 14, the thermal spreader 1304 has a larger projection area on the first redistribution layer 802 than that of the first semiconductor die 810*a*, in accordance with some embodiments. Opposite sidewalls of the thermal spreader 814 may be substantially aligned with opposite sidewalls S1 and S1' of the first semiconductor die 810*a*, which extend in the first direction D1. The thermal spreader 814 may extend in the first direction D1 to cover the sidewall S3 of the first semiconductor die 810*a*, which extends in the first direction D2.

In summary, the semiconductor package structure according to the present disclosure includes a thermal spreader connected to two or more semiconductor dies. The thermal spreader has a higher thermal conductivity than the semiconductor dies to improve the efficiency of thermal dissipation. Moreover, the thermal spreader can share the heat of the semiconductor dies. In addition, the thermal spreader connects the semiconductor dies to a redistribution layer, so that the redistribution layer can also serve as a thermal dissipation path for further enhancing the thermal dissipation.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:

a first redistribution layer;

a first semiconductor die and a second semiconductor die disposed side-by-side over the first redistribution layer;

a thermal spreader vertically overlapping the first semiconductor die and/or the second semiconductor die;

a molding material surrounding the thermal spreader, the first semiconductor die and the second semiconductor die; and a second redistribution layer disposed over the molding material, wherein the second redistribution layer comprises one or more passivation layers and one or more conductive layers disposed in the one or more passivation layers.

2. The semiconductor package structure as claimed in claim 1, wherein opposite sidewalls of the thermal spreader are substantially aligned with opposite sidewalls of the first semiconductor die.

3. The semiconductor package structure as claimed in claim 1, wherein opposite sidewalls of the thermal spreader are substantially aligned with a sidewall of the first semiconductor die and a sidewall of the second semiconductor die.

4. The semiconductor package structure as claimed in claim 1, further comprising a plurality of conductive pillars disposed between the first redistribution layer and the second redistribution layer and arranged in a first direction in a top view, wherein the first semiconductor die has a first sidewall and the second semiconductor die has a second sidewall, and the first sidewall and the second sidewall extend in a second direction which is different from the first direction.

5. The semiconductor package structure as claimed in claim 4, wherein the thermal spreader extends in the first direction to cover the first sidewall of the first semiconductor die in the top view.

6. The semiconductor package structure as claimed in claim 5, wherein the thermal spreader further covers the second sidewall of the second semiconductor die in the top view.

7. The semiconductor package structure as claimed in claim 5, wherein the first semiconductor die has a third sidewall extending in the first direction, and the third sidewall is exposed by the thermal spreader in the top view.

8. The semiconductor package structure as claimed in claim 5, wherein the first semiconductor die and the second semiconductor die are arranged in the second direction.

9. The semiconductor package structure as claimed in claim 5, wherein the first semiconductor die and the second semiconductor die are arranged in the first direction.

10. A semiconductor package structure, comprising:

a first redistribution layer;

a first semiconductor die and a second semiconductor die disposed over the first redistribution layer;

a thermal spreader disposed over the first semiconductor die and the second semiconductor die;

a molding material extending below the thermal spreader and between the first semiconductor die and the second semiconductor die; and a second redistribution layer disposed over the thermal spreader, wherein the second redistribution layer comprises one or more passivation layers and one or more conductive layers disposed in the one or more passivation layers.

11. The semiconductor package structure as claimed in claim 10, wherein the thermal spreader has a larger projection area than the first semiconductor die and the second semiconductor die.

12. The semiconductor package structure as claimed in claim 10, wherein the thermal spreader is in contact with the second redistribution layer.

13. The semiconductor package structure as claimed in claim 12, wherein the thermal spreader is partially embedded in the second redistribution layer.

14. The semiconductor package structure as claimed in claim 10, wherein the thermal spreader is bonded onto the second redistribution layer through an adhesion layer.

15. The semiconductor package structure as claimed in claim 14, wherein the adhesion layer is surrounded by the molding material.

16. The semiconductor package structure as claimed in claim 14, wherein the adhesion layer is disposed in the second redistribution layer.

17. A semiconductor package structure, comprising:

a first redistribution layer;

a first semiconductor die and a second semiconductor die disposed side-by-side over the first redistribution layer;

a thermal spreader disposed over the first semiconductor die;

a molding material spacing apart the second semiconductor die from the first semiconductor die and the thermal spreader; and a second redistribution layer disposed over the molding material, wherein the second redistribution layer comprises one or more passivation layers and one or more conductive layers disposed in the one or more passivation layers.

18. The semiconductor package structure as claimed in claim 17, wherein a thickness of the second semiconductor die is greater than a total thickness of the first semiconductor die and the thermal spreader.

19. The semiconductor package structure as claimed in claim 17, wherein the second semiconductor die is bonded onto the second redistribution layer through an adhesion layer.

20. The semiconductor package structure as claimed in claim 17, wherein the thermal spreader has a larger projection area than the first semiconductor die.

* * * * *